United States Patent
Mizukoshi et al.

(10) Patent No.: US 11,694,755 B2
(45) Date of Patent: Jul. 4, 2023

(54) NONVOLATILE MEMORY WITH DATA RECOVERY

(71) Applicant: SanDisk Technologies LLC, Addison, TX (US)

(72) Inventors: Hiroyuki Mizukoshi, Kawasaki (JP); Heguang Li, Newark, CA (US); Althaf Rahamathulla, San Jose, CA (US); Qihan Li, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/337,329

(22) Filed: Jun. 2, 2021

(65) Prior Publication Data

US 2022/0392555 A1    Dec. 8, 2022

(51) Int. Cl.
  *G11C 16/34*   (2006.01)
  *G11C 29/02*   (2006.01)
  *G11C 16/26*   (2006.01)
  *G11C 16/10*   (2006.01)

(52) U.S. Cl.
  CPC ........ *G11C 16/3481* (2013.01); *G11C 16/102* (2013.01); *G11C 16/26* (2013.01); *G11C 16/3459* (2013.01); *G11C 29/021* (2013.01)

(58) Field of Classification Search
  None
  See application file for complete search history.

(56) References Cited

U.S. PATENT DOCUMENTS

| | | | |
|---|---|---|---|
| 7,345,928 B2 | 3/2008 | Li | |
| 8,026,544 B2 * | 9/2011 | Ito | G11C 11/5621 257/E29.304 |
| 9,053,810 B2 | 6/2015 | Dutta et al. | |
| 9,575,888 B2 | 2/2017 | Kim | |
| 9,740,419 B2 * | 8/2017 | Wakchaure | G11C 11/4096 |
| 9,899,077 B2 | 2/2018 | Hsu et al. | |
| 2017/0271017 A1 * | 9/2017 | Kanamori | G11C 11/5628 |
| 2020/0381316 A1 * | 12/2020 | Lee | H01L 22/32 |
| 2020/0395082 A1 * | 12/2020 | Vishwanath | G11C 29/52 |

* cited by examiner

*Primary Examiner* — Alfredo Bermudez Lozada
(74) *Attorney, Agent, or Firm* — Vierra Magen Marcus LLP

(57) ABSTRACT

An apparatus includes control circuits configured to connect to a plurality of non-volatile memory cells. The control circuits are configured to abort fine programming of the plurality of non-volatile memory cells at an intermediate stage and read the plurality of non-volatile memory cells at the intermediate stage to obtain first partial data of at least one logical page. The control circuits are configured obtain the at least one logical page of data by combining the first partial data with second partial data of the at least one logical page stored in data latches.

20 Claims, 23 Drawing Sheets

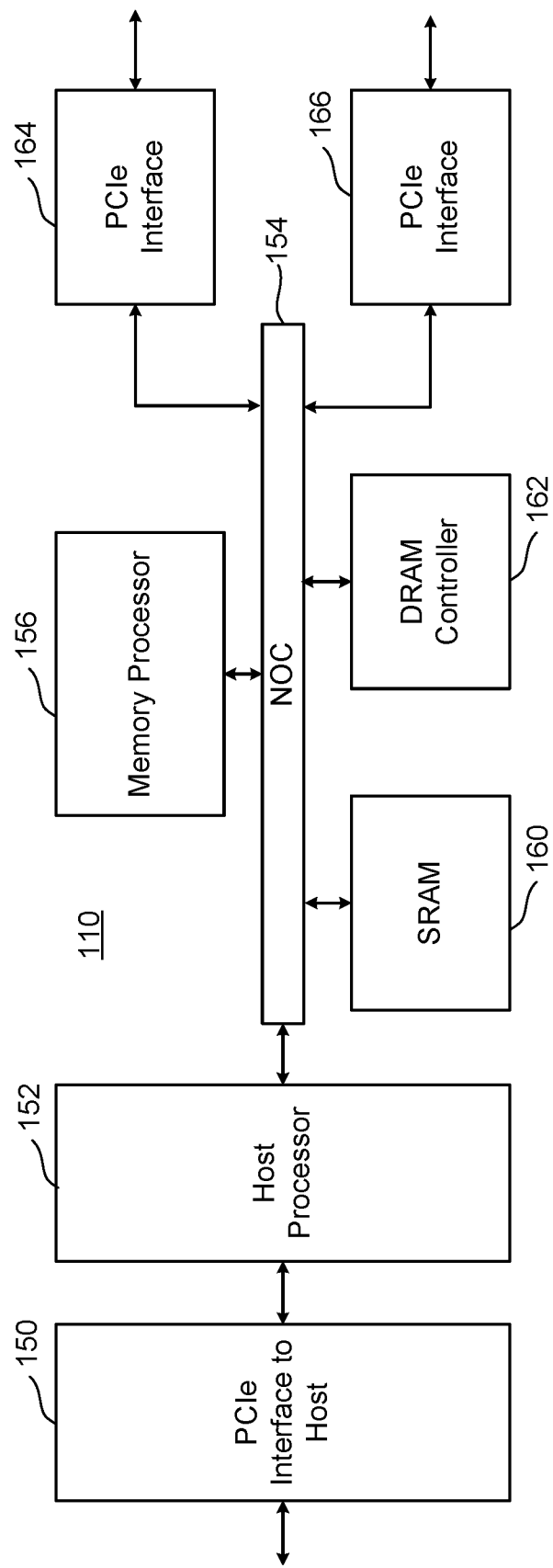

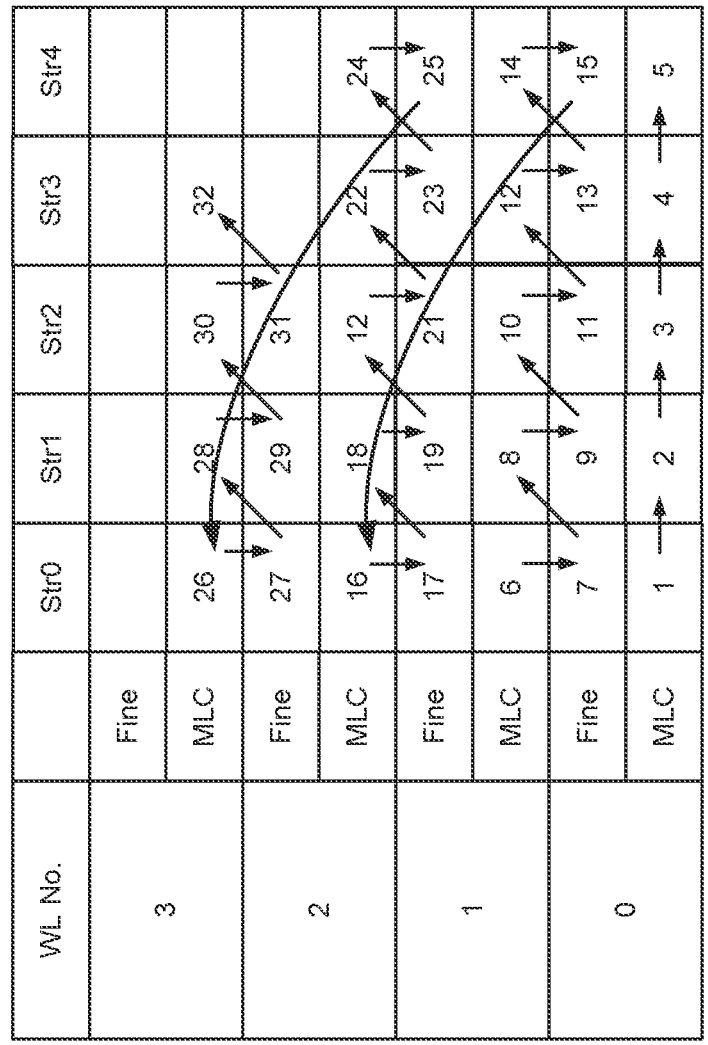

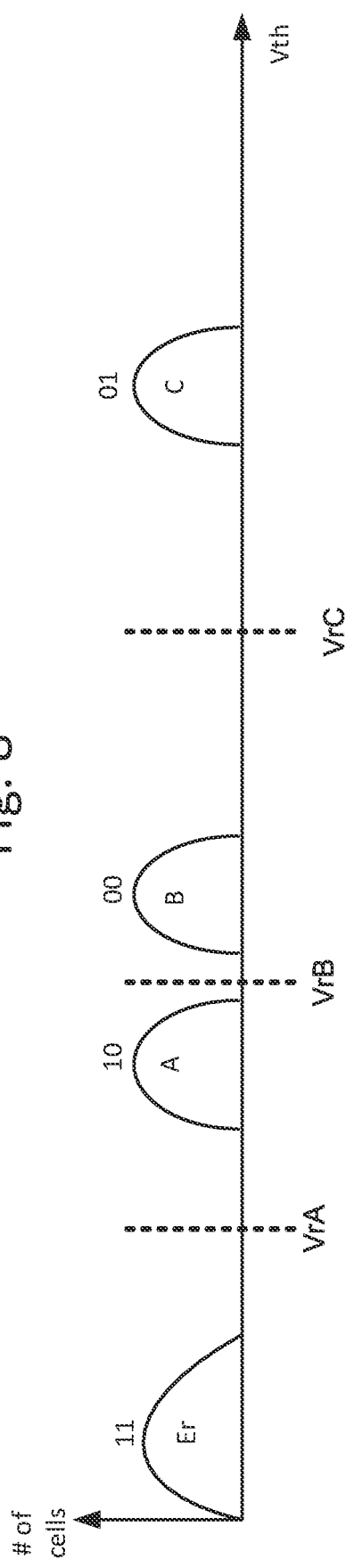

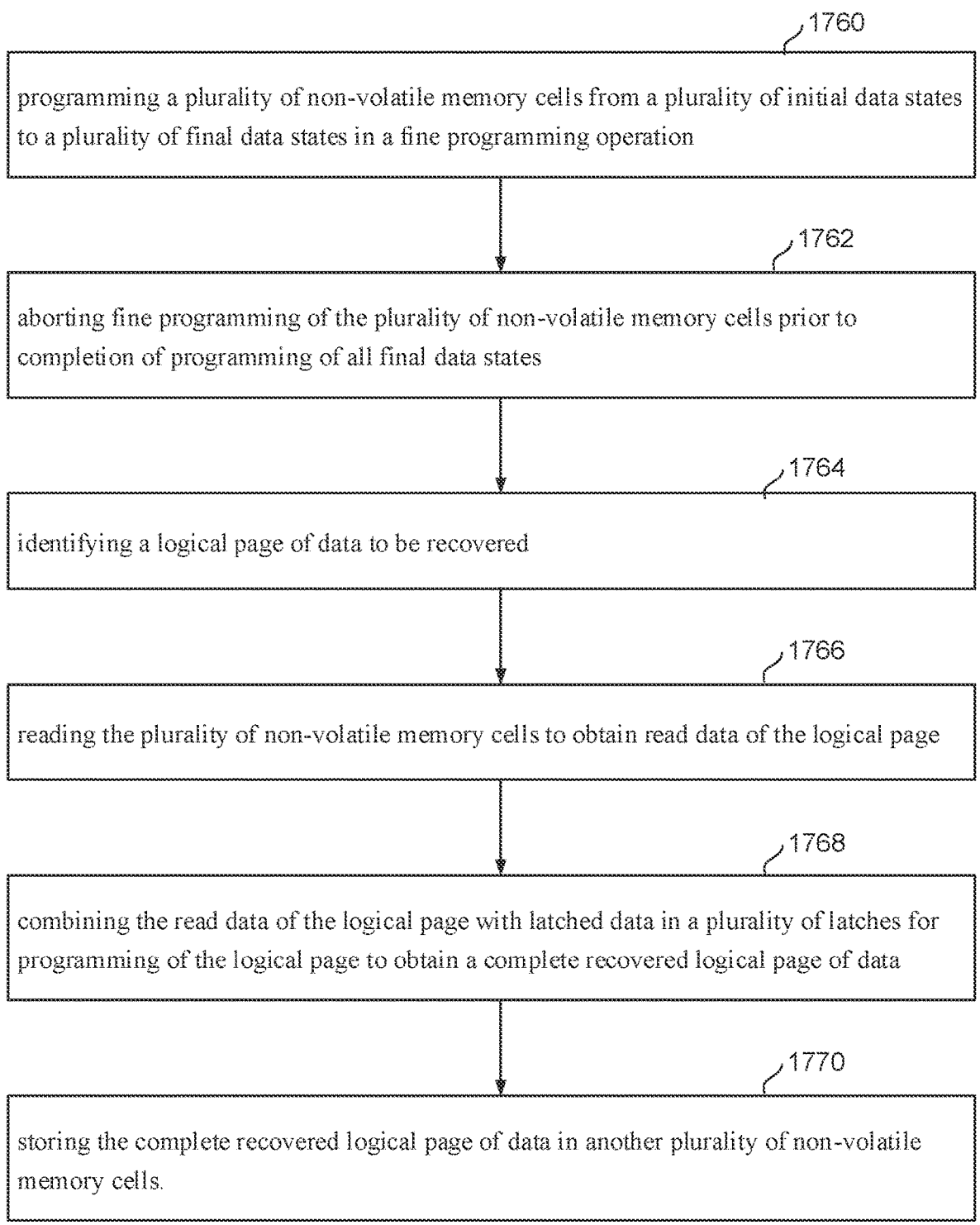

NONVOLATILE MEMORY WITH DATA RECOVERY

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell. Some memories store one bit per cell using two data states (Single Level Cell or SLC) while others store more than one bit per cell using more than two data states (Multi Level Cell or MLC, which may store two bits per cell). Storing four bits per cell may use sixteen data states may (Quad Level Cell or QLC).

When a memory system is deployed in or connected to an electronic device (the host), the memory system can be used to store data and read data. When power is lost during storage of data in non-volatile memory cells, there is a risk that the data being stored may not be fully programmed in the non-volatile memory cells prior to power loss. It is generally desirable to be able to access such data after power is restored.

BRIEF DESCRIPTION OF THE DRAWINGS

Like-numbered elements refer to common components in the different Figures.

FIG. 1B is a block diagram of one embodiment of a Front-End Processor Circuit. In some embodiments, the Front-End Processor Circuit is part of a Controller.

FIGS. 7A-B shows an example of MLC-fine programming.

FIG. 8 shows an example of reading MLC data.

FIG. 9 shows an example of an encoding scheme.

FIG. 17 shows an example of a method that includes combining read data and latched data to obtain a complete logical page of data.

DETAILED DESCRIPTION

Figure 1A:
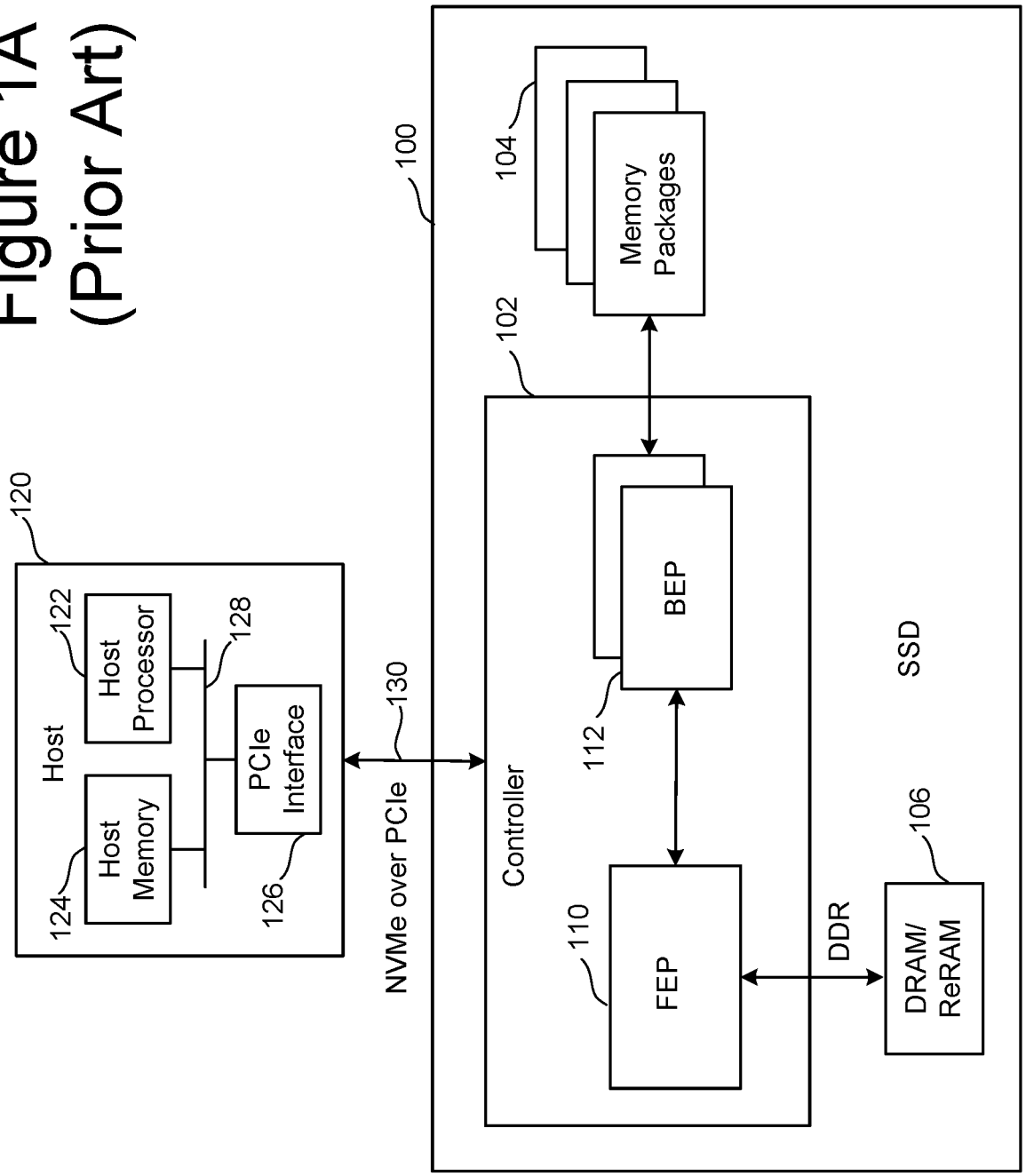
FIG. 1A is a block diagram of one embodiment of a memory system connected to a host.

Techniques are disclosed herein to enable a memory system to prepare for a loss of power in a manner that reduces risk of losing data. For example, when power is about to be lost during a programming operation, a memory system may prepare for such a power loss by ensuring that data is in a condition that allows later access (e.g., after power is restored).

In some examples, non-volatile memory cells are programmed in multiple operations with neighboring non-volatile memory cells programmed prior to final programming (e.g., non-volatile memory cells along a given word line may be programmed in a first programming operation and later, after programming of a neighboring word line, may be further programmed in a second programming operation). In some cases, an initial programming operation stores two bits of data (MLC programming) and a final programming operation performs fine programming to store more than two bits per cell (e.g., QLC storage of four bits per cell). The initial data may correspond to two logical pages of data and the QLC data may correspond to the two logical pages stored in MLC plus an additional two logical pages. Prior to final programming, the initial data may be read from the non-volatile memory cells and combined with additional data (and may be converted to a suitable format) for final programming. Such a scheme may be efficiently implemented because no separate buffer is required for the initial data between initial programming and final programming (e.g., the same non-volatile memory cells that are to be QLC programmed store the initial data in MLC format prior to QLC programming).

In some scenarios, when a write abort occurs during programming of non-volatile memory cells, it may be challenging to ensure that all data can be recovered. For example, if power loss occurs during fine (final) programming using an MLC-fine programming scheme that does not separately store (buffer) data that is programmed in MLC format, it may be difficult to recover some or all data being fine programmed. Non-volatile memory cells no longer reflect only the initial (e.g., MLC) data states once some fine programming has occurred but do not yet accurately reflect all final (e.g., QLC) data states. While data may be stored in data latches for programming, during programming such data latches may be flipped (e.g., from logic "0" to logic "1") as memory cells are verified at target threshold voltages. Thus, a complete copy may not be stored in latches either.

In some cases, there may be some warning of an upcoming power loss and some preparation is possible to ensure that data is not lost. In examples described below, in preparation for an imminent power loss during a final programming operation, non-volatile memory cells may be read to obtain partial data of one or more logical page (e.g., partial data corresponding to final data states that have been programmed). Additional partial data for the one or more logical pages is obtained from latches holding the data for final programming and this partial data is combined with the read partial data to obtain a complete copy of the one or more logical page. The logical page(s) recovered in this way may be saved in a safe manner (e.g., programmed in another block in SLC format) prior to actual loss of power so that the data can be read after power is restored.

FIG. 1A is a block diagram of one embodiment of a memory system 100 connected to a host 120. Memory system 100 can implement the technology proposed herein. Many different types of memory systems can be used with the technology proposed herein. One example memory system is a solid-state drive ("SSD"); however, other types of memory systems can also be used. Memory system 100 comprises a Controller 102, non-volatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
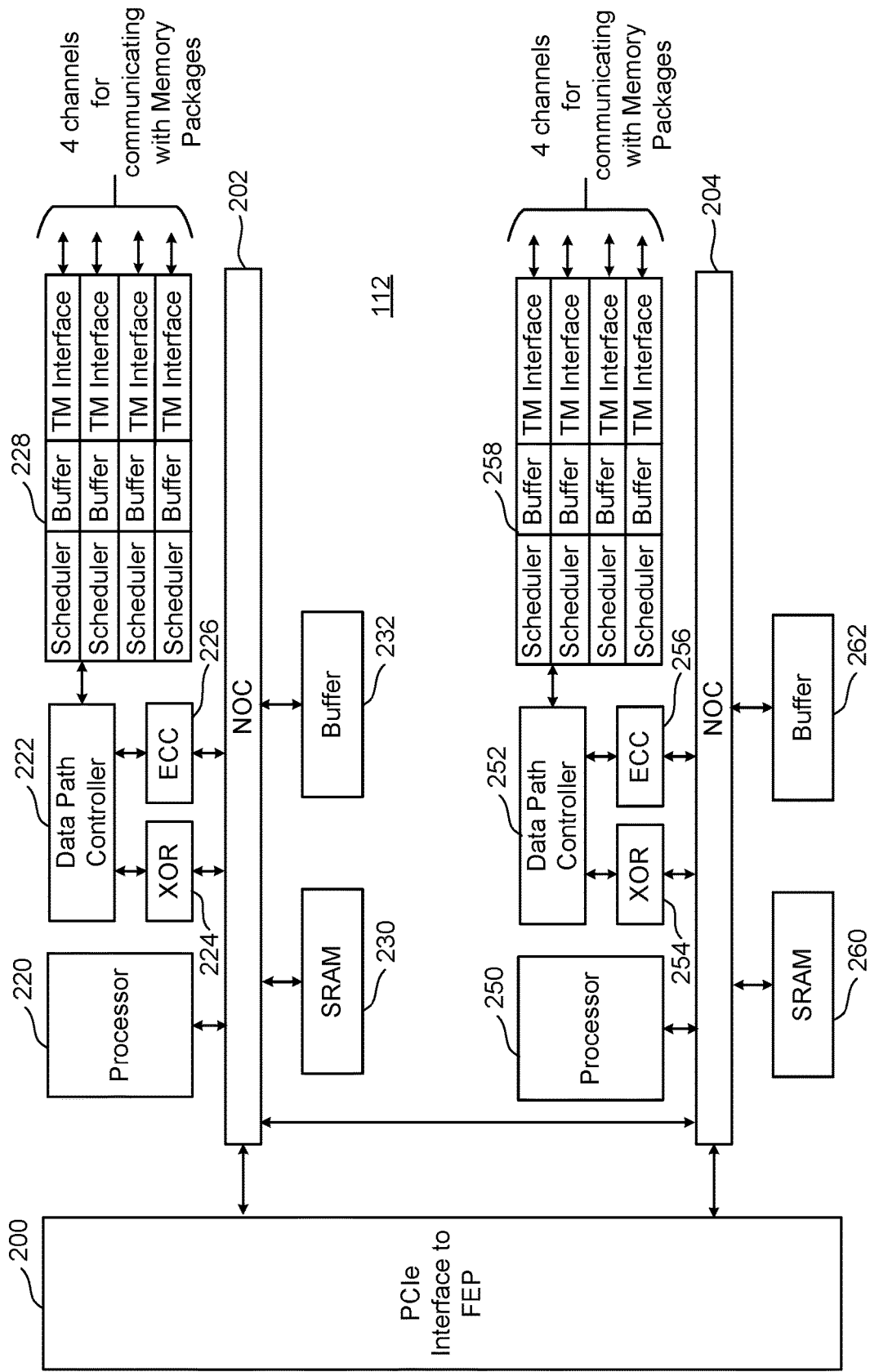
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
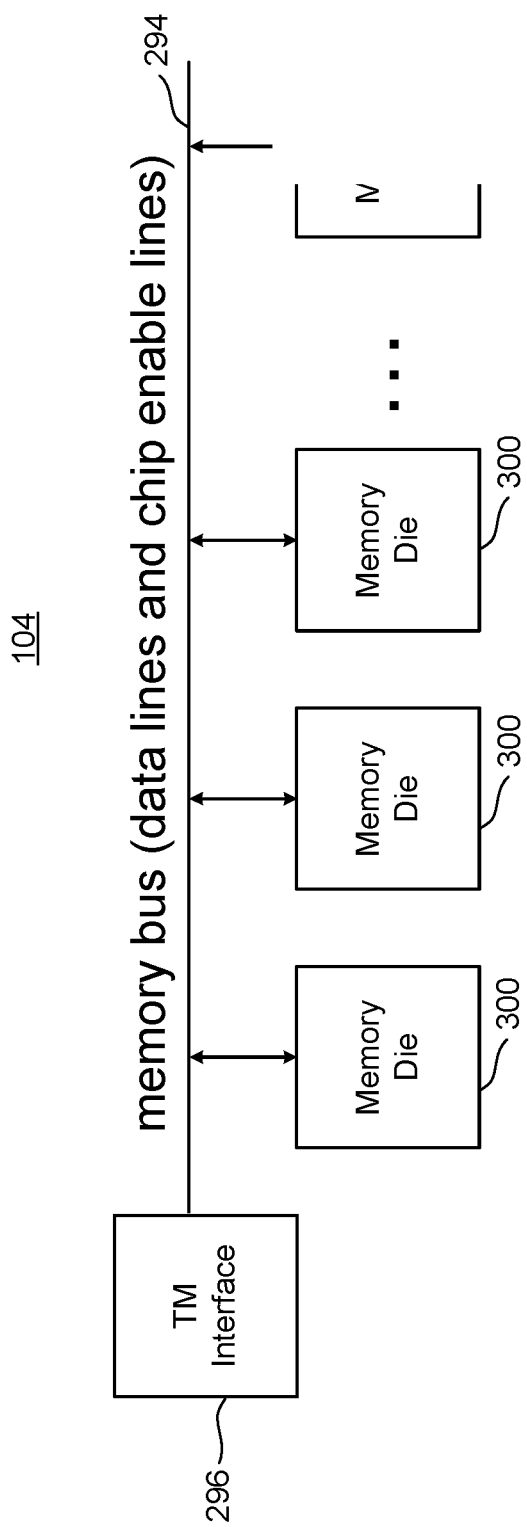
FIG. 1D is a block diagram of one embodiment of a memory package.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2A:
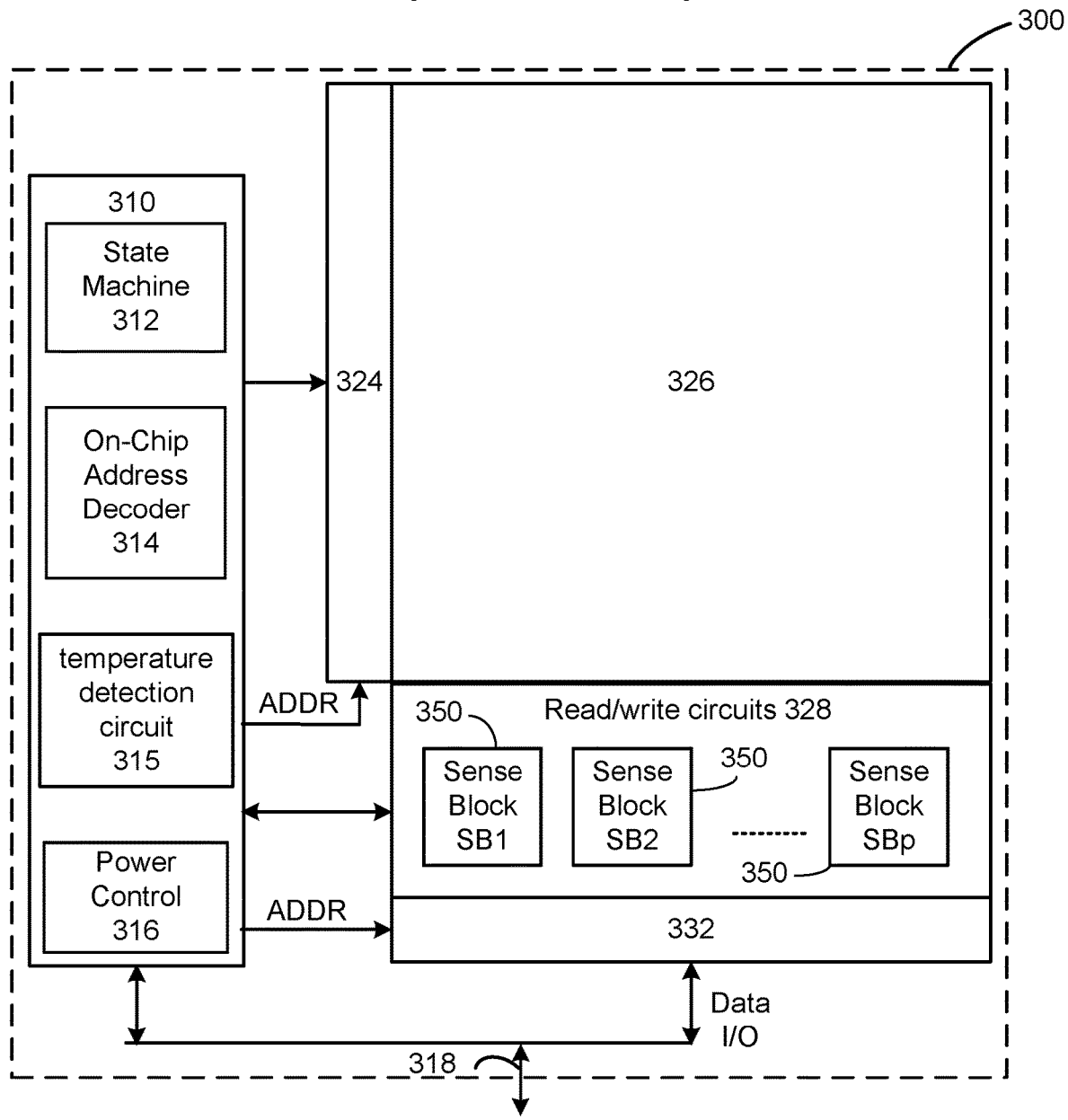
FIG. 2A is a functional block diagram of an embodiment of a memory die.

FIG. 2A is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . ,SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
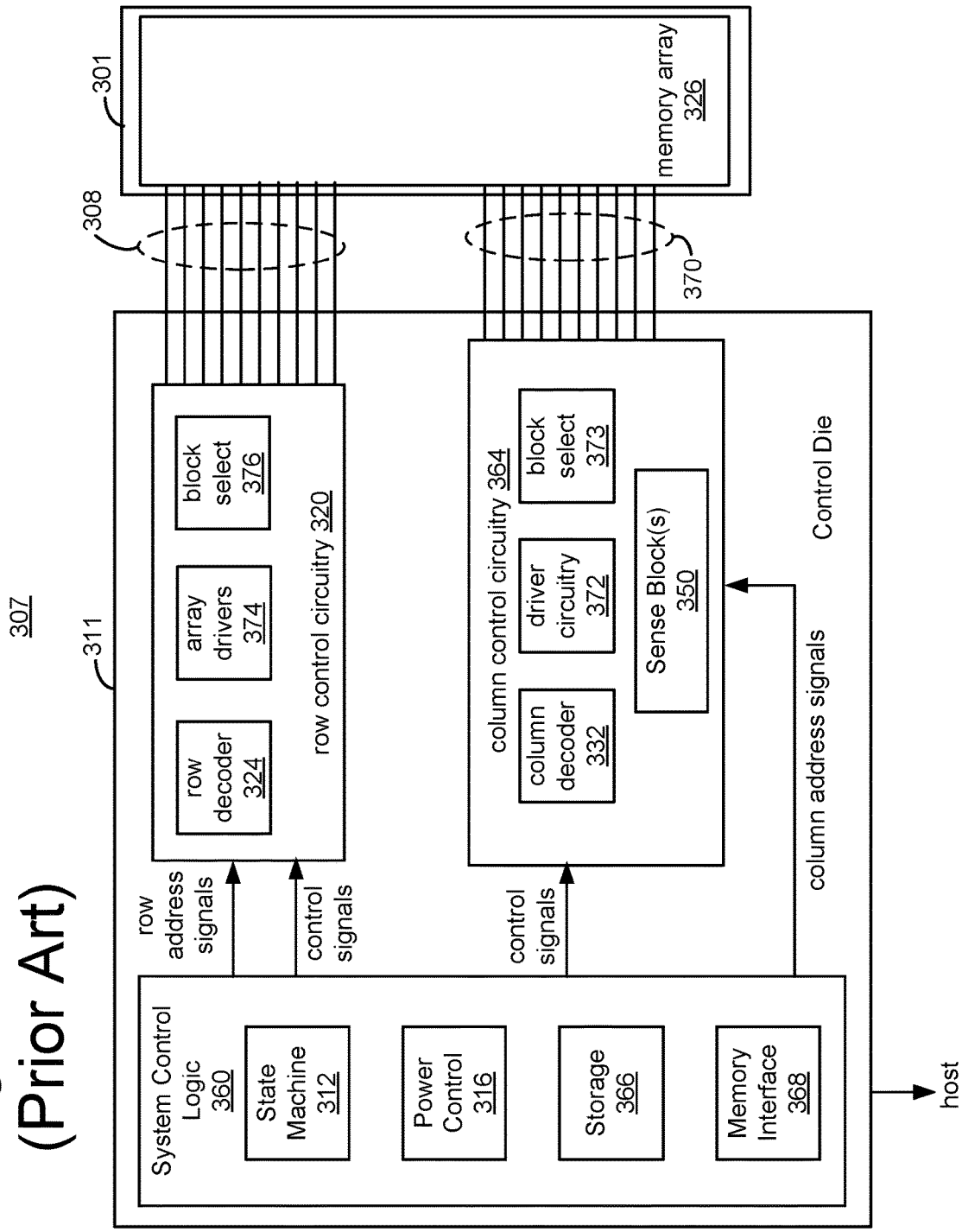
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package 104 in storage system 100. The integrated memory assembly 307 includes two types of semiconductor die (or more succinctly, "die"). Memory die 301 includes memory array 326 (memory structure). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory structure die 301.

In some embodiments, there is more than one control die 311 and/or more than one memory die 301 in an integrated memory assembly 307. In some embodiments, the integrated memory assembly 307 includes a stack of multiple control die 311 and multiple memory structure die 301. In some embodiments, each control die 311 is affixed (e.g., bonded) to at least one of the memory structure dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
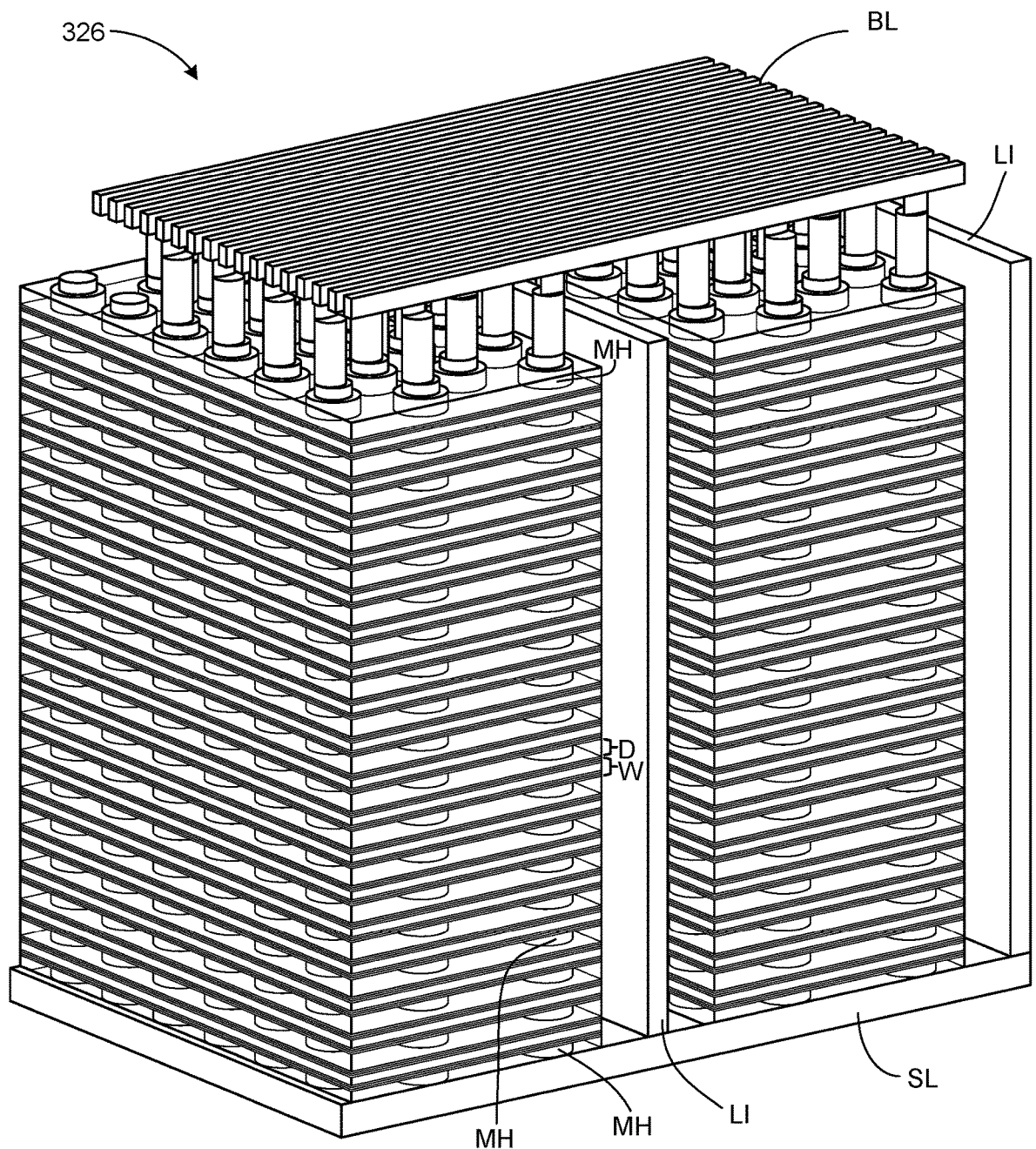
FIG. 3 is a perspective view of a portion of one embodiment of a monolithic three-dimensional memory structure.

FIG. 3 is a perspective view of a portion of one example embodiment of a monolithic three-dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers.

For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory array that comprises memory structure 326 is provided below with respect to FIG. 4A-4C.

Figure 4A:
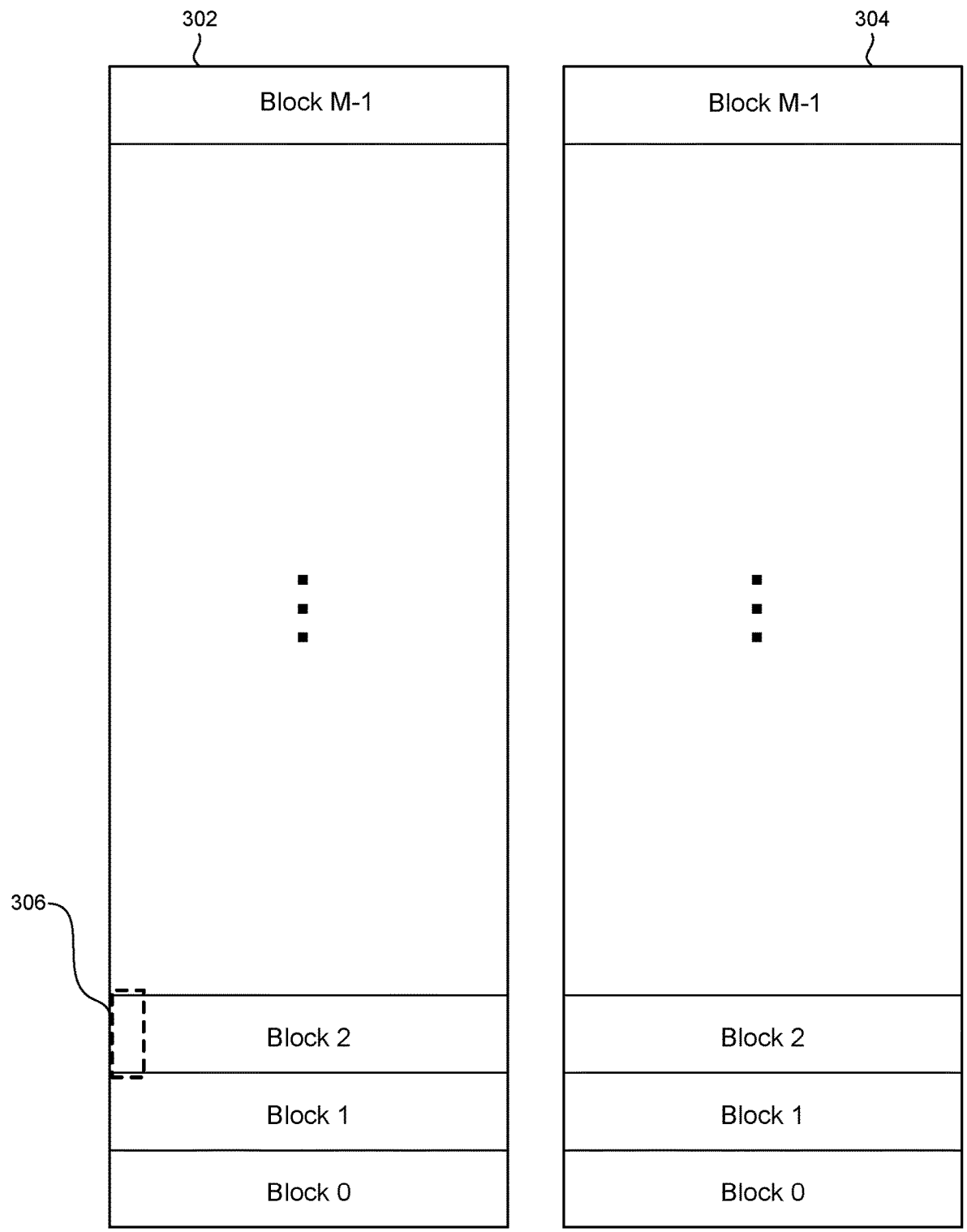
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
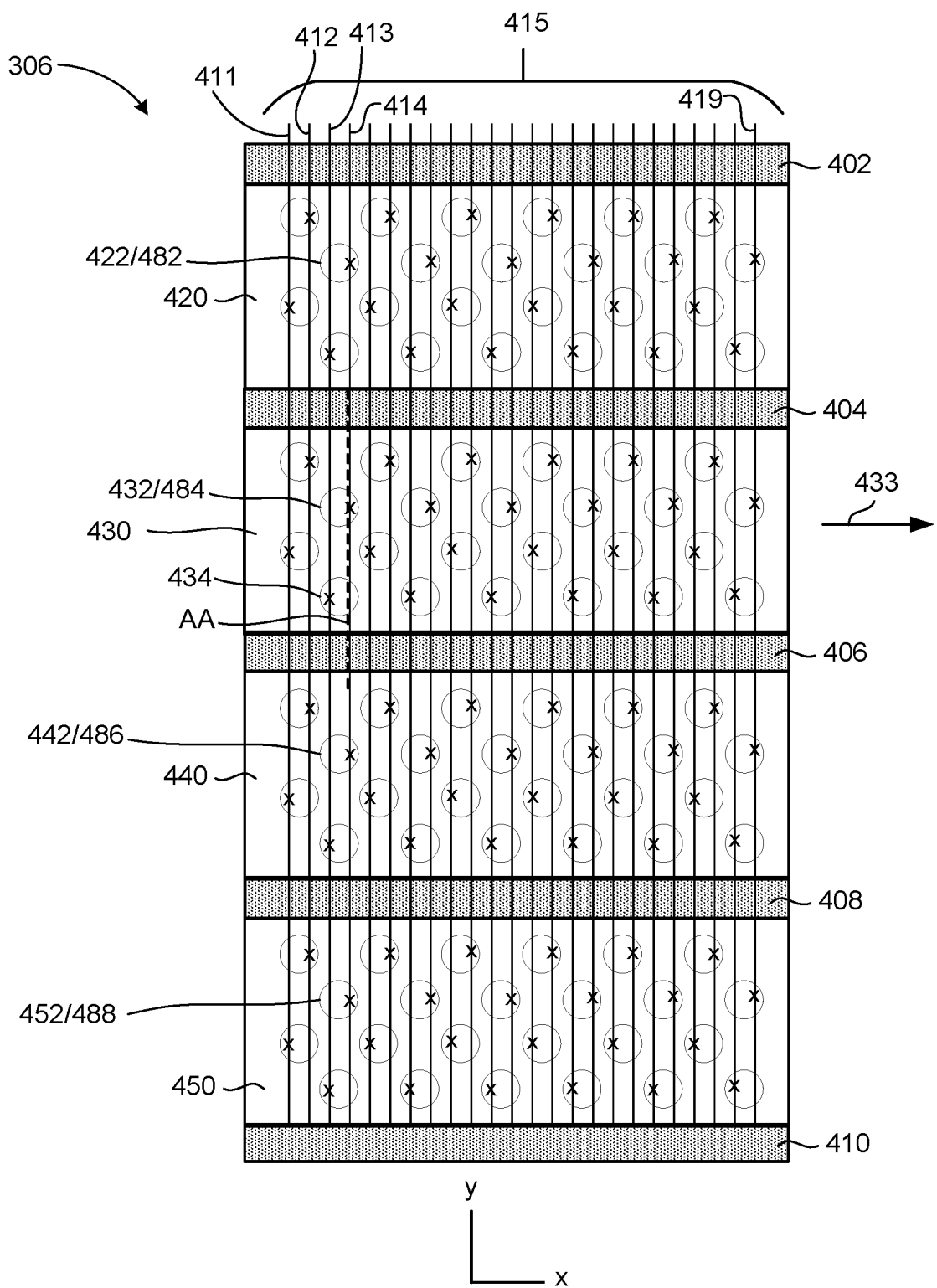
FIG. 4B depicts a top view of a portion of a block of memory cells.
Figure 4C:
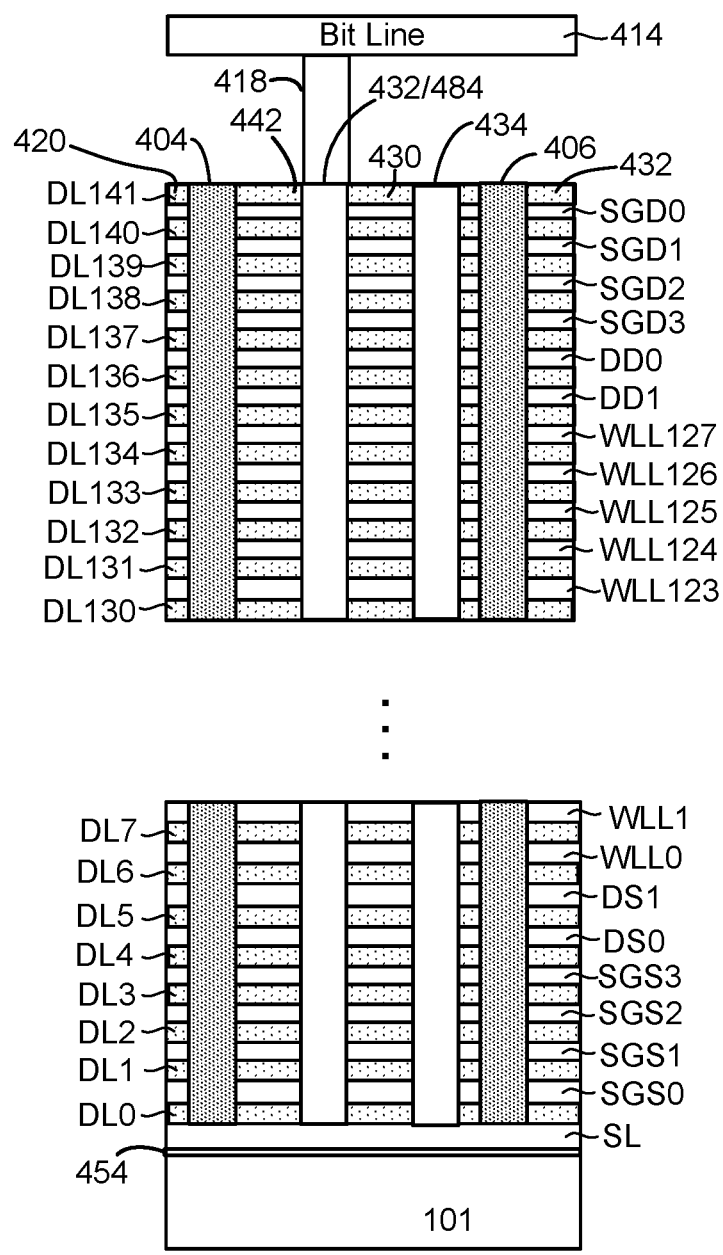
FIG. 4C depicts a cross sectional view of a portion of a block of memory cells.

FIGS. 4B-4C depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, ... 419. FIG. 4B shows twenty-four bit lines because only a portion of the block is depicted. It is contemplated that more than twenty-four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three-dimensional memory structure 326 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty-eight data word line layers WLL0-WLL127 for connecting to data memory cells. Other embodiments can implement more or less than four drain side select layers, more or less than four source side select layers, more or less than four dummy word line layers, and more or less than one hundred- and twenty-eight-word line layers. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Although the example memory system of FIGS. 3-4C is a three-dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Figure 5:
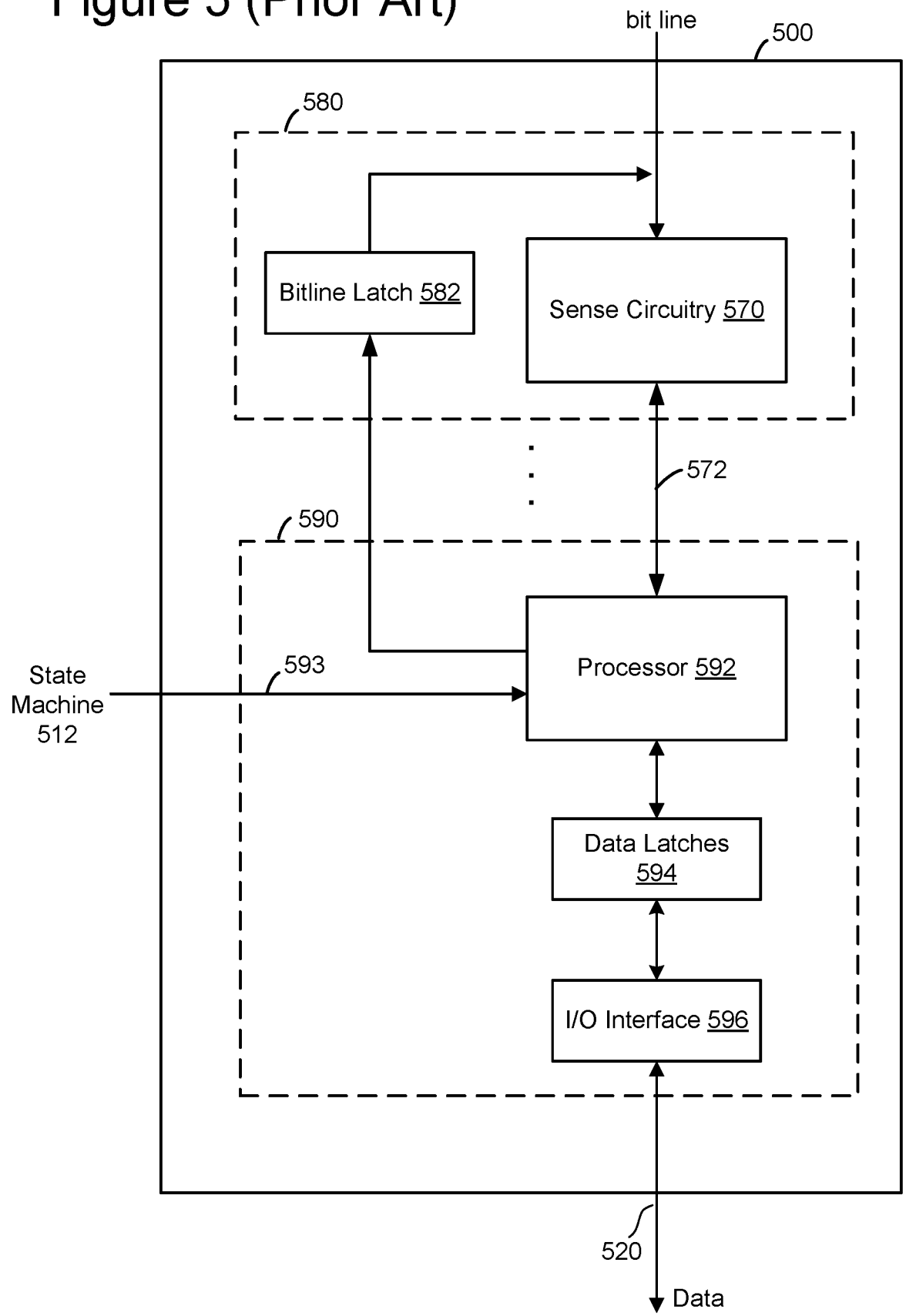
FIG. 5 shows an example of a sense block.

FIG. 5 depicts one embodiment of a sense block 500, such as sense block 350 in FIGS. 2A-B. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. Processor 592 may also move data between latches and perform operations on data in latches (e.g., performing logic operations such as Exclusive OR (XOR) operations. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latches 594 include a stack of data latches corresponding to the sense module. In one embodiment, there are three or more data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 6:
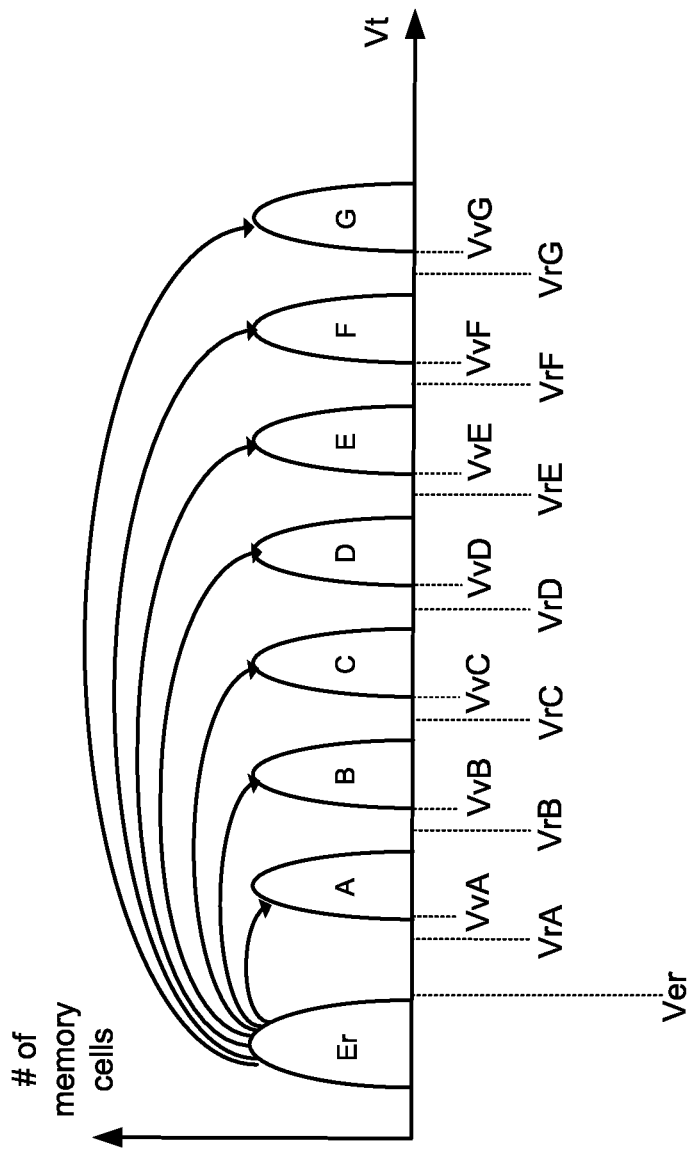
FIG. 6 shows multiple data states of nonvolatile memory cells.

FIG. 6 illustrates an example threshold voltage distributions for the memory array when each memory cell stores three bits of data. Other embodiments, however, may use other data capacities per memory cell (e.g., such as one, two, four, or five bits of data per memory cell). Storing more than one bit of data per memory cell using more than two data states is referred to as Multi-Level Cell (MLC), e.g., storing two bits per cell using four data states is an example of MLC. Storing one bit of data per memory cell using two data states is referred to a Single-Level Cell (SLC). Storing four bits of data per memory cell using sixteen data states is referred to as Quad-Level Cell (QLC). FIG. 6 shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits.

FIG. 6 shows seven verify reference voltages, VvA, VvB, VvC, VvD, VvE, VvF, and VvG. When programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC, and so on up to state G. FIG. 6 also shows Ver, which is a voltage level to test whether a memory cell has been properly erased.

FIG. 6 also shows seven read reference voltages, VrA, VrB, VrC, VrD, VrE, VrF, and VrG for reading data from memory cells. By testing whether the threshold voltage of a given memory cell is above or below the seven read reference voltages (e.g., performing sense operations using a sense block such as sense block 350), the system can determine what data state (e.g., Er, A, B, C, . . . ) a memory cell is in. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. While FIG. 6 shows all data states being programmed from the erased state together, in other examples, particularly with large numbers of data states, programming may be performed in multiple operations.

Figure 7A:
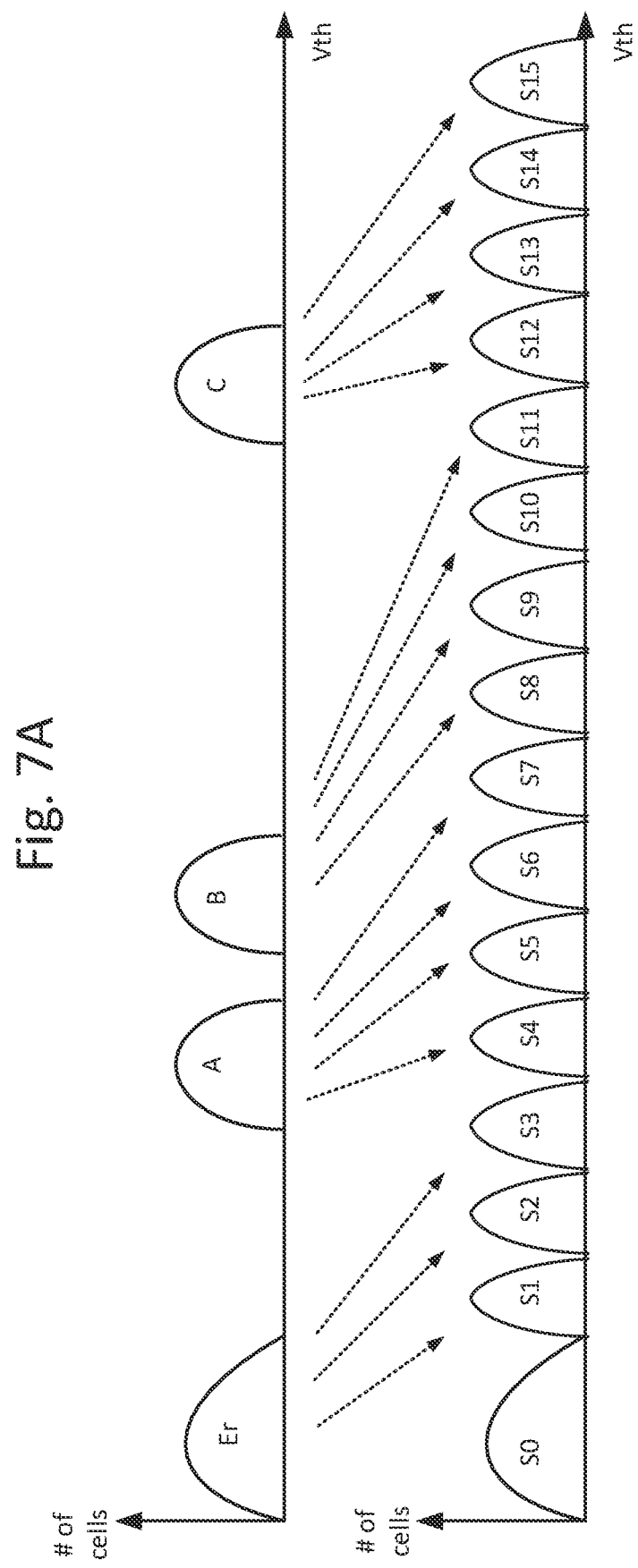

FIG. 7A shows an example of MLC-fine programming for QLC memory cells (e.g., in memory structure 326) that are initially programmed into four initial data states, Er, A, B, and C, roughly corresponding to fine data states S0, S4, S6, and S12. The top portion of FIG. 7A shows initial distributions Er, A, B, and C resulting from initial (MLC) programming while the bottom portion shows distributions S0 to S15 resulting from subsequent final (fine) programming and shows the correspondence between MLC and fine data states. MLC programmed data uses the four initial data states Er, A, B, and C (four data states representing two bits) while fine programmed data uses the sixteen data states S0-S15 (sixteen fine data states representing four bits). Non-volatile memory cells are MLC programmed with two bits of data and subsequently fine programmed with two additional bits of data using an appropriate encoding scheme. Prior to fine programming, MLC programmed data may be read (e.g., by sensing to identify non-volatile memory cells in data states Er, A, B, and C) to obtain two bits of data and then the non-volatile memory cells may be further programmed with an additional two bits of data (further programmed from data states Er, A, B, and C to data states S0-S15). Programming non-volatile memory cells in two operations (e.g., as illustrated in FIG. 7A) may allow fine programming to occur at a time when some neighboring non-volatile memory cells have been programmed. This may mitigate effects of charge in neighboring non-volatile memory cells on fine programmed data states and thus reduce error rates when fine programmed data is read. MLC programming data in non-volatile memory cells in this way may obviate the need for separate buffers for such data prior to fine programming (e.g., MLC data may not be stored elsewhere). However, misreading MLC programmed data may result in fine programming to the wrong data states so that final data is wrongly programmed.

FIG. 7B illustrates an example scheme for MLC-fine programming of non-volatile memory cells along word lines WL 0-3 that programs neighboring non-volatile memory cells between MLC programming and fine programming of given non-volatile memory cells using two stages as illustrated in FIG. 7A. Word lines are indicated in the left column with the second from left column indicating MLC and fine programming operations for each of the NAND strings of columns 3-7 (Str0 to Str4). Numbers in the resulting table indicate the order of MLC and fine programming operations for respective word lines and NAND strings.

Programming begins with MLC programming (1-5) of strings 0 to 4 along word line 0, followed by MLC programming of string 0 of word line 1 (6) and fine programming of string 0 of word line 0 (7). Programming proceeds to alternate between MLC programming along word line 1 and fine programming along word line 0 so that before fine programming of a given string of word line 0, a corresponding string of word line 1 is MLC programmed. After completion of fine programming along word line 0 and MLC programming along word line 1 (15), programming proceeds to MLC programming of word line 2 and fine programming of word line 1. Programming alternates between word lines so that MLC programming of a given string of word line 2 occurs before fine programming of a corresponding string of word line 1. It can be seen that programming using such a scheme ensures that fine programming of a given non-volatile memory cell occurs after MLC programming of neighboring non-volatile memory cells along neighboring word lines.

In some cases, prior to fine programming of a given group of non-volatile memory cells (e.g., fine programming of any word line/string combination in FIG. 7B), MLC data may be read from the group of non-volatile memory cells to obtain the MLC data they store. In some cases, such MLC data may not be stored elsewhere, which may reduce required buffering capacity associated with schemes that keep safe copies of such data. The MLC data obtained from such a read may be combined with additional data and the combined data may then be programmed in a fine programming operation. For example, four initial data states may be used to store two bits per non-volatile memory cell in an MLC programming operation. These two bits may later be read, combined with two bits of additional data, and the resulting four bits of data may be programmed in a fine programming operation.

FIG. 8 shows an example of reading a plurality of non-volatile memory cells that are MLC programmed (not yet fine programmed, as shown in the upper portion of FIG. 7A) to obtain two bits of data per cell (e.g., to obtain two initial logical pages of data from a physical page of non-volatile memory cells). Each distribution is shown with a corresponding data state that includes a first and a second bit corresponding to first and second logical page data. For example, distribution Er corresponds to a first bit "1" and second bit "1". Distribution A corresponds to a first bit "1" and second bit "0". Distribution B corresponds to first and second bits "0". Distribution C corresponds to first bit "0"

and second bit "1". Reading the non-volatile memory cells at the three read voltages shown, VrA, VrB, and VrC allows non-volatile memory cells to be identified as belonging to one of these four distribution so that the first and second logical pages of data may be obtained. The two logical pages of data thus obtained may be combined with additional data for fine programming. For example, these two initial logical pages of data may be considered lower page and middle page data respectively and may be combined with two additional logical pages of data (e.g., referred to as "upper page" and "top page" data) for fine programming of four pages in QLC format. The mapping of bits of different logical pages to distributions in FIG. 8 is for illustration only and it will be understood that different mappings may be used with the present technology.

FIG. 9 shows an example of an encoding scheme that may be used in an MLC-fine encoding scheme (e.g., in FIGS. 7A-B), which uses sixteen data states to store four bits per non-volatile memory cell. Using such a scheme, a group of non-volatile memory cells may store four logical pages of data (Lower, Middle, Upper, and Top pages) as illustrated. The encoding scheme may be referred to as an example of a 3-2-5-5 encoding scheme, indicating the number of read levels required for reading each logical page illustrated. For example, the lower page may be obtained by reading at S6, S8 and S10, (3 read levels) the middle page may be obtained by reading at S4 and S12 (2 read voltages), the upper page may be obtained by reading at S2, S5, S9, S13, and S15 (5 read voltages), and the top page may be obtained by reading at S1, S3, S7, S11, and S14 (5 read voltages). Other encoding schemes may also be used. While the scheme of FIG. 9 may be convenient for efficient reading of data, other schemes may have other characteristics that make them appropriate in some instances. For example, some encoding schemes may be convenient for programming data. In some cases, data may be converted between encoding schemes to take advantage of characteristics of different schemes. Thus, while data stored in non-volatile memory cells may be encoded as shown in FIG. 9, during programming, the data may be converted to another encoding scheme that may offer advantages for programming purposes.

Figure 10:
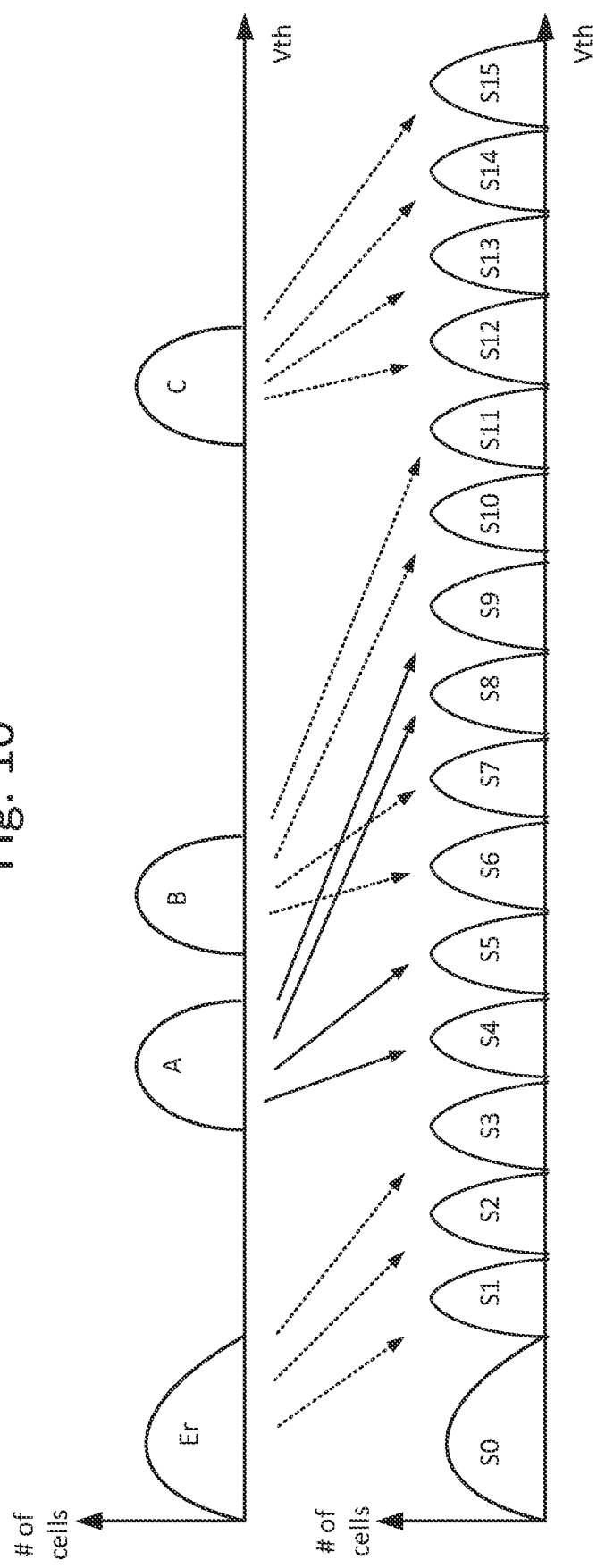
FIG. 10 shows an example of MLC-fine programming.

MLC-fine programming may be performed in various ways and the present technology is not limited to any particular programming scheme or any number of bits per cell. FIG. 10 illustrates an alternative MLC-fine programming scheme to that of FIG. 7A. FIG. 10 shows a different mapping from the initial data states (Er, A, B, C) to the final data states (fine programmed data states S0-S15). While initial data state Er is mapped to final data states S0-S3 and initial data state C is mapped to final data states S12-S15 as before, the mapping from initial data states A and B to final data states S4-S11 is different from the example of FIG. 7A. Instead of mapping initial data state A to neighboring distributions S4 to S7 and mapping initial data state B to neighboring distributions S8-S11, in FIG. 10 initial data state A is mapped to final data states S4-S5 and S8-S9 with initial data state B mapped to final data states S6-S7 and S10-S11. Thus, initial data states are mapped to final data states that occupy discontinuous threshold voltage ranges. Cells being fine programmed from initial data state A to final data states S8 and S9 transition through a threshold voltage range corresponding to initial data state B and final data states S6-S7. And cells being fine programmed from initial data state B to final data states S10 and S11 transition through a threshold voltage range corresponding to final data states S8 and S9. Such crossover of threshold voltages during fine programming may present additional challenges in certain scenarios, for example, when attempting to read data that is not completely programmed (e.g., when programming is aborted at an intermediate stage because of power loss or other reason).

Figure 11:
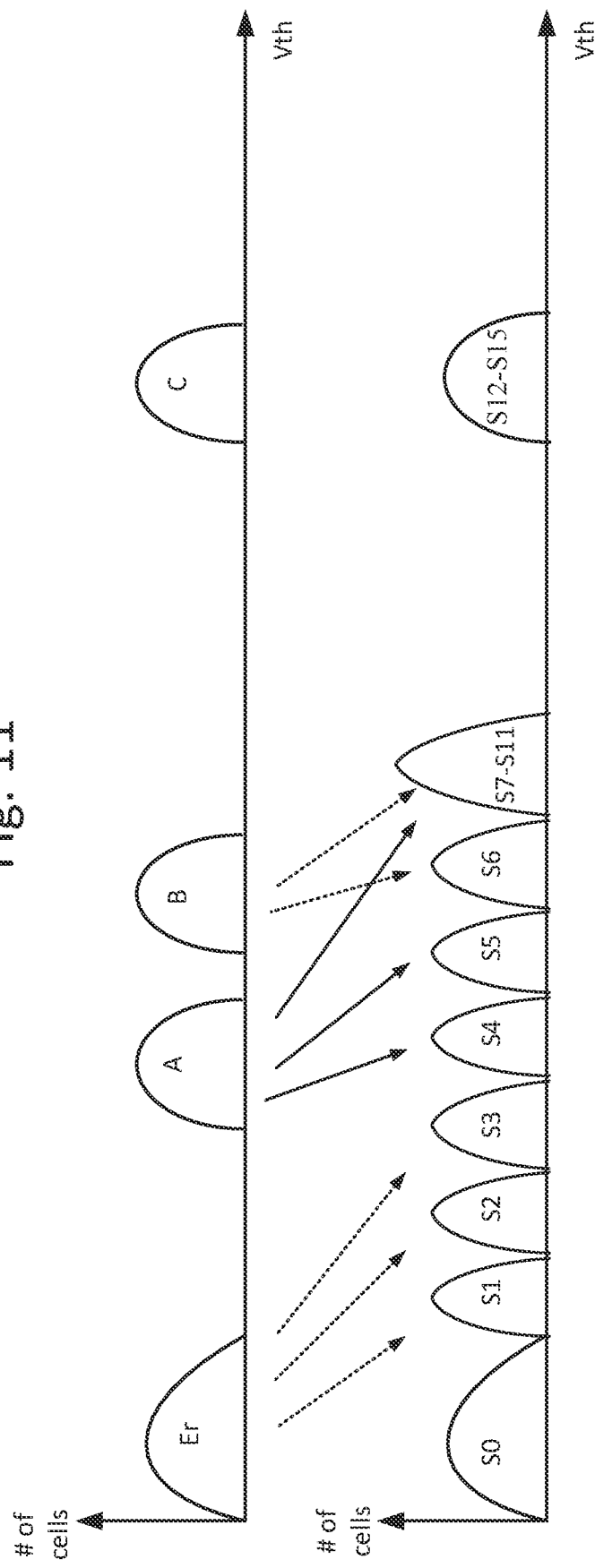
FIG. 11 shows an example of MLC-fine programming at an intermediate stage before all final data states are programmed.

FIG. 11 shows an example of non-volatile memory cells (e.g., in memory structure 326) that have been only partially fine programmed (e.g., with fine programming stopped at an intermediate stage, prior to completion of programming of all final data states S0-S15). This condition may arise from a write abort occurring during a fine programming operation (e.g., a write abort command may be received in response to detection of an imminent power loss). Attempting to read the partially programmed data of FIG. 11 is challenging because distribution S7-S11 includes non-volatile memory cells that were previously in both A and B data states so that recovering the MLC programmed data represented by Er, A, B, and C states from the non-volatile memory cells may be difficult or impossible.

In some cases, when a power loss is detected, power may continue for some period of time (e.g., when external power from a battery or other source is removed, a capacitor or other local power storage device may continue to provide power for some limited period). In general, the power and/or time available after detection of a Sudden Power Down (SPD) may be limited so that continuing a fine programming operation to completion may not be possible if fine programming is not close to completion.

Preparing a non-volatile memory die for loss of power within a limited time and/or power budget may be challenging if such a power loss occurs during fine programming. For example, in some cases MLC data that was stored in non-volatile memory cells (e.g., in Er, A, B, and C states of FIG. 11) may not be stored elsewhere (e.g., no safe copy in a buffer). While a copy of such data may be read from the non-volatile memory cells into data latches prior to initiating fine programming, the latches may be reset (e.g., set to logic "1") as the corresponding non-volatile memory cells are verified at corresponding threshold voltages so that a complete copy of MLC data may not remain in latches (e.g., data for at least some logical pages in latches may be incomplete because latches associated with final data states S0-S7 have already been reset). Also, while some final data states may be programmed (S0-S7 in FIG. 11), other final data states (S8-S15) are not yet programmed so that the non-volatile memory cells do not contain a complete copy of such data either (e.g., only partial lower and middle page data corresponding to final data states S0-S7 is present in the non-volatile memory cells). Thus, complete copies of some or all logical pages may not be obtainable simply by reading the non-volatile memory cells at this stage.

According to examples of the present technology described below, a memory die that includes non-volatile memory cells that are partially fine programmed as in FIG. 11 may prepare for loss of power (e.g., in response to a write abort command) by reading the non-volatile memory cells to obtain first partial data of at least one logical page (e.g., lower or middle page data associated with final data states S0-S7) and obtaining second partial data of the logical page(s) from data latches used for programming (e.g., latches corresponding to final data states S8-S15 are not yet reset because non-volatile memory cells have not been verified at these levels). The first and second partial data may be combined to obtain the complete logical page(s). The recovered complete logical page(s) may then be written elsewhere in preparation for power loss and for accessing subsequent to restoration of power. For example, in order to write the data within a limit (e.g., time limit and/or power limit) a complete logical page may be written in SLC format (e.g., in another block), which can be done more rapidly using less power than fine programming or MLC programming. Subsequently, after power is restored following a period without power, the logical page(s) may be read from these locations.

Figure 12:
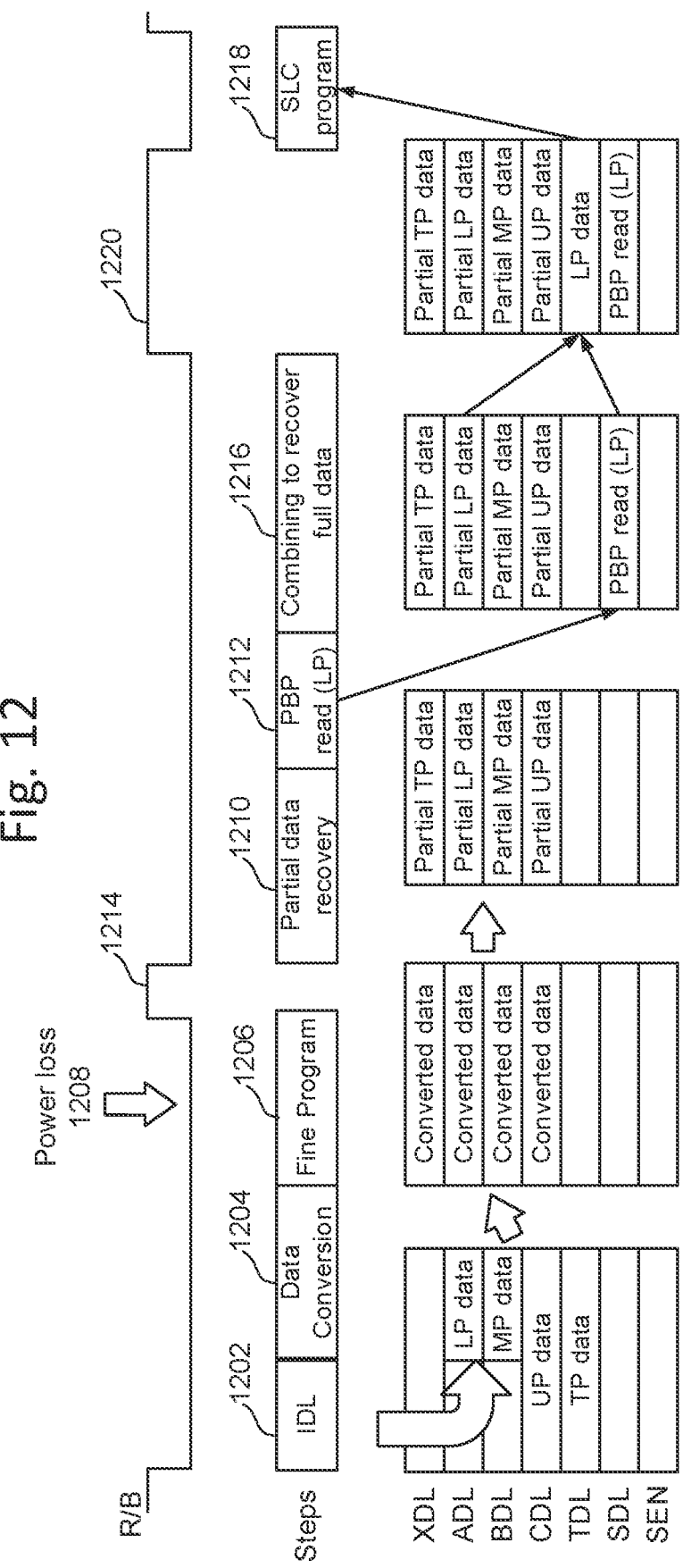
FIG. 12 shows an example of a power loss during fine programming.

FIG. 12 illustrates an example of the present technology including a ready/busy "R/B" signal asserted by a memory die, steps in a graceful shutdown process (e.g., in preparation for power loss) and the contents of data latches at different steps during the graceful shutdown. The example of FIG. 12 may be implemented on a memory die such as memory die 300 using read/write circuits 328 in combination with control circuits 310. Initially, the memory die performs an Internal Data Load (IDL) step 1202 to read MLC data of lower page ("LP") and middle page ("MP") stored in non-volatile memory cells along a word line that was previously MLC programmed (e.g., in an MLC stage of an MLC-fine sequence as illustrated in FIGS. 7A-7B). The memory die asserts a busy condition on the R/B line during IDL. The LP and MP data are loaded into latches (ADL and BDL, in this example). Upper page and top page data were previously loaded into latches (CDL and TDL, in this example) so that all four logical pages of data to be stored in the non-volatile memory cells are latched together in latches (e.g., data latches 594). Subsequently a data conversion step 1204 converts the latched data and stores the converted data in the latches ("Converted data" in data latches XDL, ADL, BDL, and CDL). Converted data may use a different encoding scheme to that of user data of LP, MP, UP, and TP (e.g., different to the encoding scheme of FIG. 9). For example, converted data may be in a format that is optimized for programming (e.g., a program format to reduce time and/or power for programming compared with using data encoded according to the initial format of FIG. 9). Thus, while the converted data is used to program LP, MP, UP, and TP data, there may not be a one-to-one correspondence between converted data in a given latch (e.g., XDL, ADL, BDL, CDL) and any logical page LP, MP, UP, or TP. During a fine programming step 1206, non-volatile memory cells are fine programmed from initial MLC distributions to final QLC distributions using the converted data in the latches (e.g., as illustrated in FIG. 10).

Power loss 1208 is detected during fine programming step 1206. For example, a memory controller may detect a power loss (e.g., supply voltage below a lower limit). Sufficient power may be available for some limited operations prior to actual loss (e.g., a capacitor or other device may continue to supply some electrical current after loss of supply voltage to a memory system). The memory controller may signal a memory die to indicate a loss of power. In response, the memory die may take appropriate action to ensure that data is safely stored prior to loss of power. If fine programming step 1206 is near completion (e.g., if fine programming can be completed within a specified time and/or power budget) then the memory die may complete fine programming and then assert a ready state on R/B line. If fine programming step 1206 is not near completion (e.g., if fine programming cannot be completed within the specified time and/or power budget) then fine programming may not be completed.

In the example of FIG. 12, partial data recovery step 1210 recovers partial data of logical pages TP, LP, MP, and UP from the converted data in latches XDL, ADL, BDL, and CDL. This is partial data because during program verify, bits are flipped as non-volatile memory cells reach their target threshold voltages resulting in inverted bits in data latches XDL, ADL, BDL, and CDL corresponding non-volatile memory cells that have completed fine programming. For example, if fine programming step 1206 stops after program verify of final data state S7 as shown in FIG. 11, latched bits corresponding to data states S0-S7 may not be recoverable from data latches and only bits corresponding to data states S8-S15 may be recovered from data latches (e.g., latches may hold only an incomplete copy of a given logical page). Returning converted data back to user data format (TP, LP, MP, and UP) reverses earlier conversion of step 1204 and may be performed rapidly by the same circuits used for data conversion 1204 (e.g., control circuits 310).

In a page-by-page (PBP) read step 1212 the lower logical page (LP) of data is read from the non-volatile memory cells. The resulting data is partial data because not all final data states are fully programmed, and some non-volatile memory cells may be misread. For example, if fine programming step 1206 stops after program verify of final data state S7 as shown in FIG. 11, only data states S0-S7 may be accurately read so that only bits corresponding to final data states S0-S7 may be obtained by reading the non-volatile memory cells. The PBP read data from step 1212 is stored in data latch SDL in this example. While only LP data is recovered in this way in the example of FIG. 12, any one or more of logical pages LP, MP, UP, and TP may be similarly recovered. The logical page to recover may be specified by a memory controller (e.g., a memory controller may send a command to the memory die when the memory die asserts R/B=ready at time 1214 to indicate which, if any, logical page to recover). In some cases, one or more logical page may be stored elsewhere (e.g., a safe copy in a buffer) and may be recovered as shown (e.g., a controller may determine whether to recover a particular logical page according to whether it is available at another location). Logical page(s) to recover may be specified by command, by default, or otherwise.

Step 1216 includes combining partial data of the lower logical page in data latch SDL (obtained from PBP read 1212) with partial data of the lower logical page in data latch ADL (obtained from partial data recovery 1210). The result is a complete copy of LP data which is stored in data latch TDL in this example. Thus, the contents of TDL represent a complete recovered logical page of data from the combination of the two partial pages of data (first partial data of LP from reading and second partial data of LP from latches).

FIG. 12 shows SLC program 1218, in which complete LP data in data latch TDL is programmed to other non-volatile memory cells (not the initial non-volatile memory cells that were partially fine programmed in step 1206). For example, the non-volatile memory cells programmed in SLC program 1218 may be in a different block to the non-volatile memory cells fine programmed in step 1206. SLC programming allows LP data to be rapidly stored (more rapidly than MLC or fine programming) so that programming (which may include up to four logical pages in some cases) may be completed withing a specified time and/or power budget. Programming of LP data from data latch TDL in SLC program 1218 by the memory die may be in response to a command from a memory controller (e.g., when memory die asserts R/B=ready at time 1220, the memory controller may send a write command specifying an SLC write to a specific location in another block).

Figure 13:
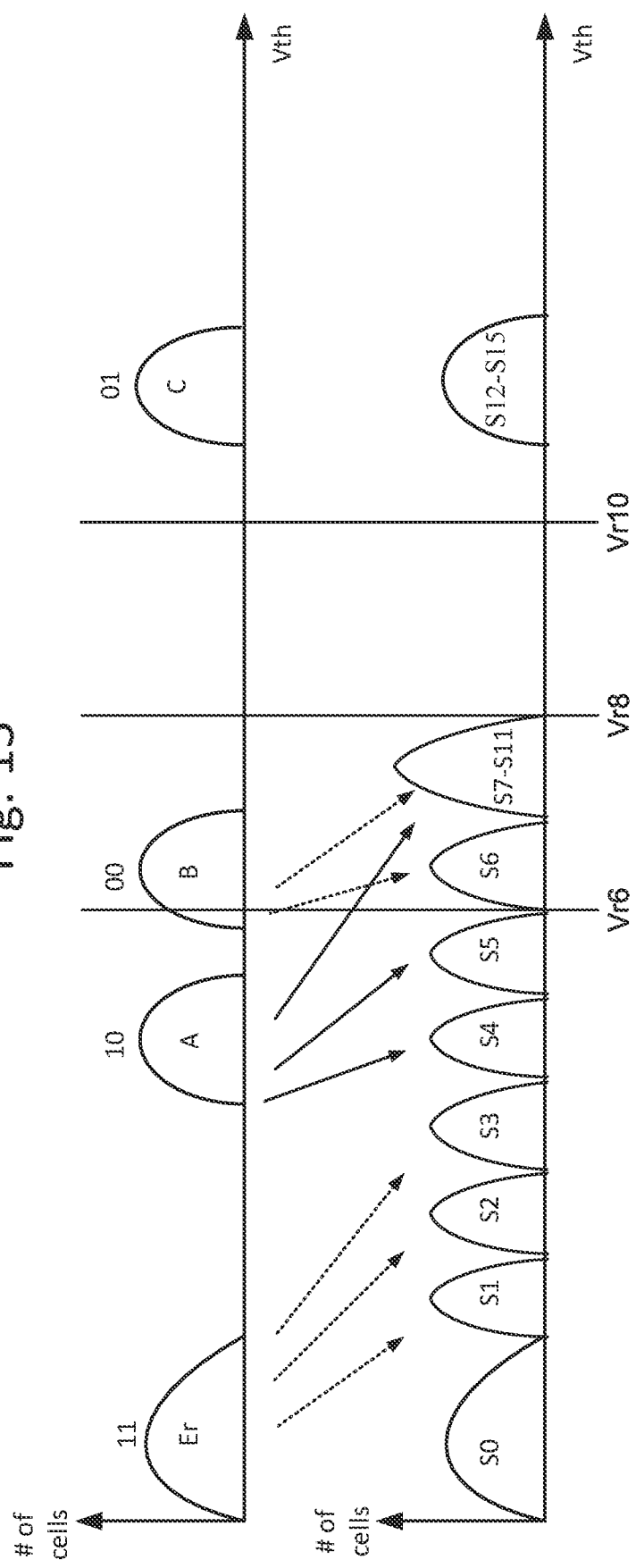
FIG. 13 shows an example of reading partial lower page data.

FIG. 13 illustrates an example of reading data from non-volatile memory cells that are partially fine programmed (e.g., PBP read 1212 of FIG. 12). Three read voltages are used to read lower page data in this example (e.g., encoding scheme of FIG. 9), Vr6 at a voltage between S5 and S6, Vr8 between S7 and S8 (not yet programmed), and Vr10 between S9 (not yet programmed) and S10 (not yet programmed). It can be seen from FIG. 9 that, after fine programming, non-volatile memory cells with threshold voltages below Vr6 or between Vr8 and Vr10 have a lower page bit "1." Non-volatile memory cells with threshold voltages below Vr6 (S0-S5) may be identified by reading using Vr6 and non-volatile memory cells to be programmed to between Vr8 and Vr10 (S8-S9) may be identified from latches holding data to be programmed (e.g., partial LP data in ADL in FIG. 12). Thus, the combination of first partial data from reading at Vr6 and second partial data in latches is sufficient to recover a complete logical page of data. While FIG. 13 illustrates a lower page read according to the encoding scheme of FIG. 9, other pages may be similarly read (e.g., middle, upper, and top pages) and the reading scheme used may depend on the encoding scheme (e.g., different read voltages may be used for a given logical page depending on the encoding scheme).

While the example of FIG. 13 shows a sequence of reads at Vr6, Vr8, and Vr10 that may also be used to read non-volatile memory cells that have been fine programmed (e.g., final programming of S0-S15), because the non-volatile memory cells of this example have not completed fine programming, a modified read operation may be sufficient to read the partially fine programmed data (S0-S7). For example, it may be sufficient to read at Vr6 only to identify non-volatile memory cells in data states S0-S5 and use latched data for remaining lower page data (e.g., data corresponding to data states S8-S15). In general, a read operation to use may be selected according to the last programmed data state (e.g., more read voltages may be used for non-volatile memory cells that are fine programmed further than data state S7 because more data is in the non-volatile memory cells and correspondingly less in data latches).

Figure 14:
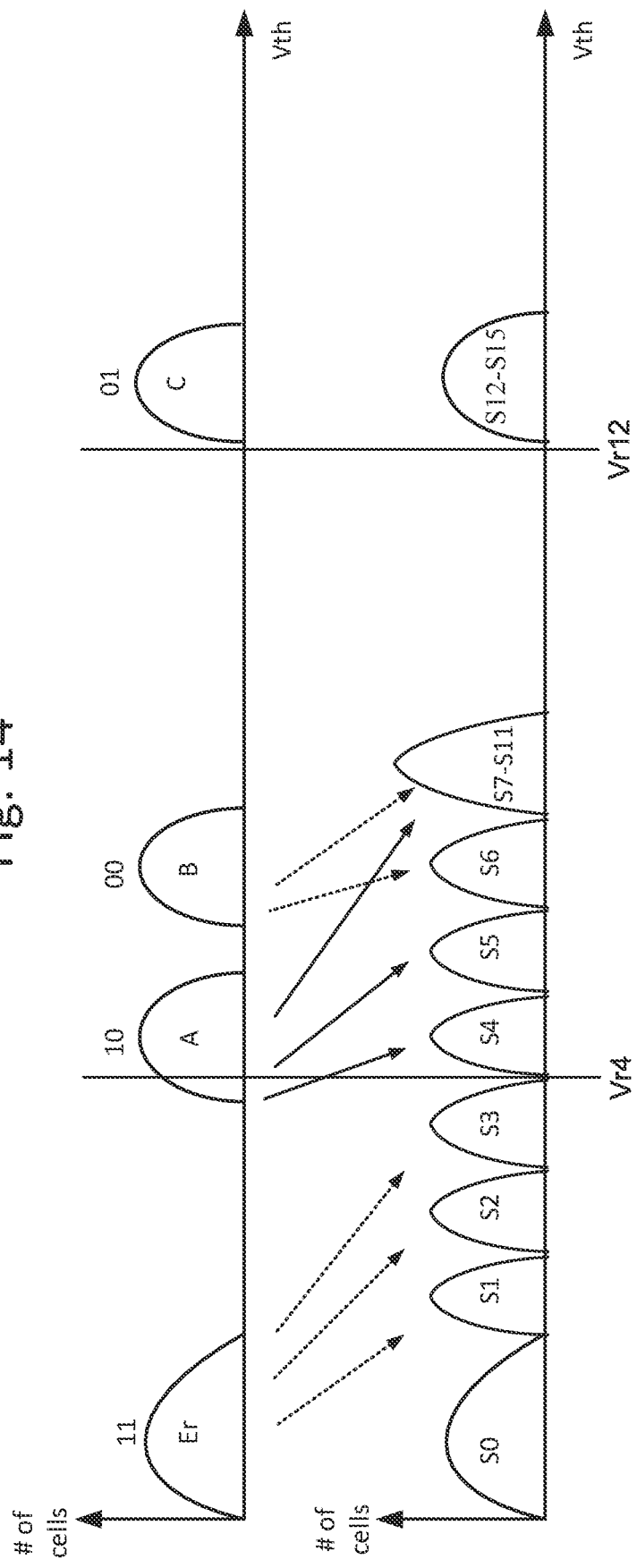
FIG. 14 shows an example of reading partial middle page data.

FIG. 14 illustrates an example of reading a middle page according to the encoding scheme of FIG. 9 when fine programming terminates early (e.g., as shown in FIG. 11). Reading the middle page requires only two read steps, at Vr4, between S3 and S4, and at Vr12, between S11 (not yet programmed) and S12 (not yet programmed). Results from reading at Vr4 may identify non-volatile memory cells in data states S0-S3, which have a middle page logic "1" and reading at Vr12 may identify non-volatile memory cells in data states S12-S15, which also have a middle page logic "1". Because fine data states S12-S15 are programmed from MLC data state C, non-volatile memory cells to be programmed to S12-S15 may be identified even though fine programming of these individual states has not occurred (e.g., reading data state C is sufficient to identify non-volatile memory cells that would be fine programmed to any of data states S12-S15). Partial data corresponding to data states S12-S15 may also be found from data latches (e.g., Partial MP data in CDL of FIG. 12).

While the example of FIG. 14 shows a sequence of reads at Vr4 and Vr14 that may be used to read non-volatile memory cells that have been fine programmed (e.g., final programming of S0-S15), because the non-volatile memory cells of this example have not completed fine programming, a modified read operation may be sufficient to read the fine programmed data (S0-S7). For example, it may be sufficient to read at Vr4 only to identify non-volatile memory cells in data states S0-S3 and use latched data for remaining middle page data (e.g., data corresponding to data states S8-S15).

Figure 15:
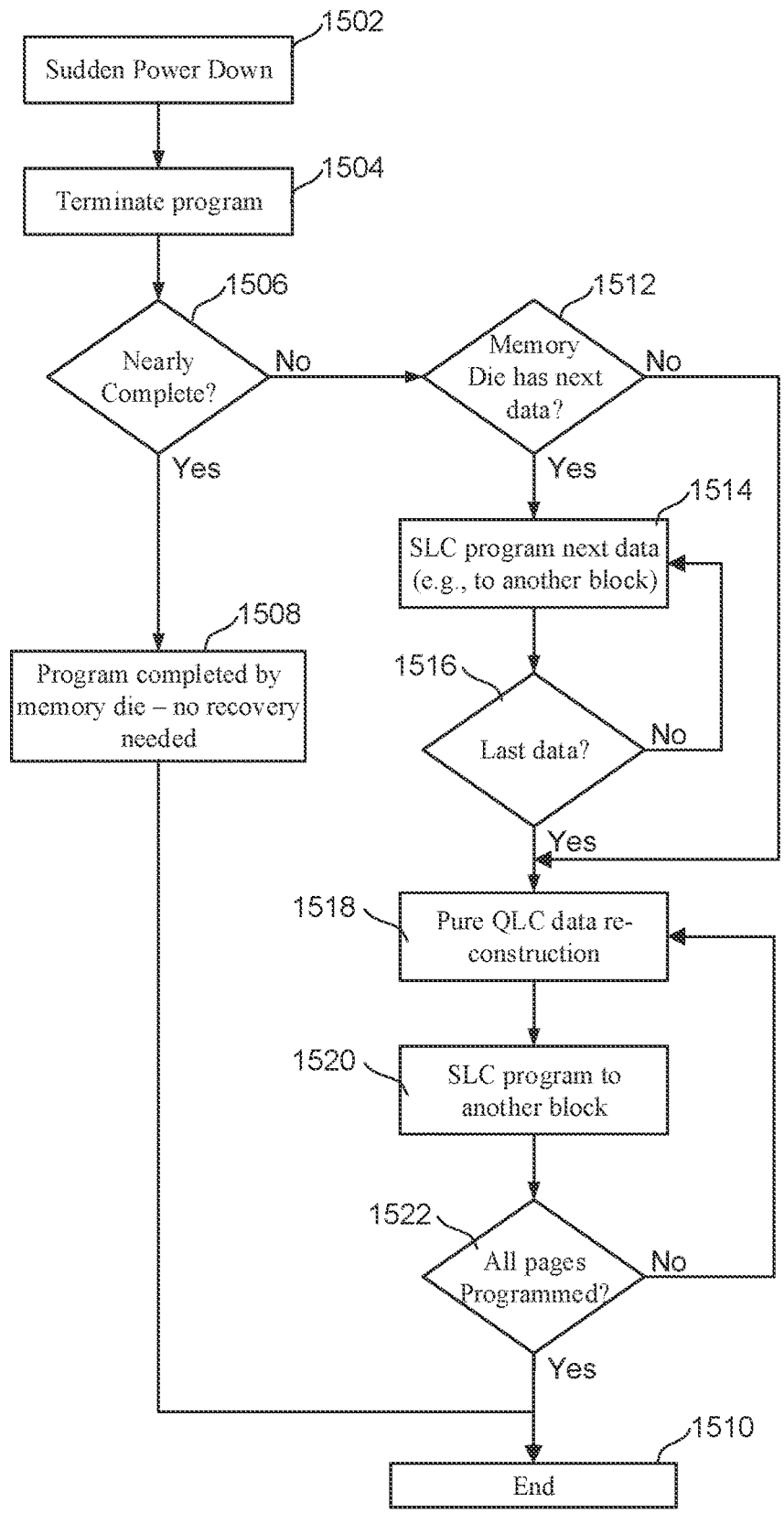
FIG. 15 shows an example of a method of handling a Sudden Power Down (SPD).

FIG. 15 illustrates an example of a method that utilizes the present technology to prepare for loss of power efficiently (e.g., within a time and/or power limit). The method may be implemented, for example, in memory die 300 coupled to controller 102. When a sudden power down (SPD) 1502 occurs, a decision to terminate programming 1504 may be made (e.g., a controller may send a corresponding command to one or more memory dies). A determination may be made as to whether programming is nearly complete 1506. For example, a determination may be made as to whether fine programming has progressed beyond a point that makes completing programming possible and/or preferable. A programming step may be identified as corresponding to near completion. For example, once final data state S13 of sixteen final data states S0-S15 is programmed and verified (and only final data states S14-S15 remain to be programmed), programming may be considered nearly complete 1506, in which case the programming is completed by the memory die and no recovery of data is needed 1508. The operation may then end 1510 (e.g., power may subsequently be lost without losing the data). If programming is not nearly complete 1506 (e.g., fine programming has progressed only to some intermediate stage such as S7, as previously shown), then a determination is made as to whether the memory die has the next data 1512 and if it does then the next data is SLC programmed (e.g., to another block) 1514. A determination is then made as to whether this is the last data 1516 and, if not the last data, then step 1514 is repeated until the last data is SLC programmed. If the memory die does not have the next data or there is no more next data to program, then pure QLC data reconstruction 1518 is used to reconstruct complete logical pages of QLC data from reading partial data from non-volatile memory cells and reading additional partial data from data latches. Reconstructed data is then SLC programmed to another block 1520. A determination is made as to whether all pages are programmed 1522. Reconstruction 1518 and SLC programming 1520 are repeated for any additional pages until all pages are programmed. Then, the operation ends 1510 and power may be lost safely.

Figure 16:
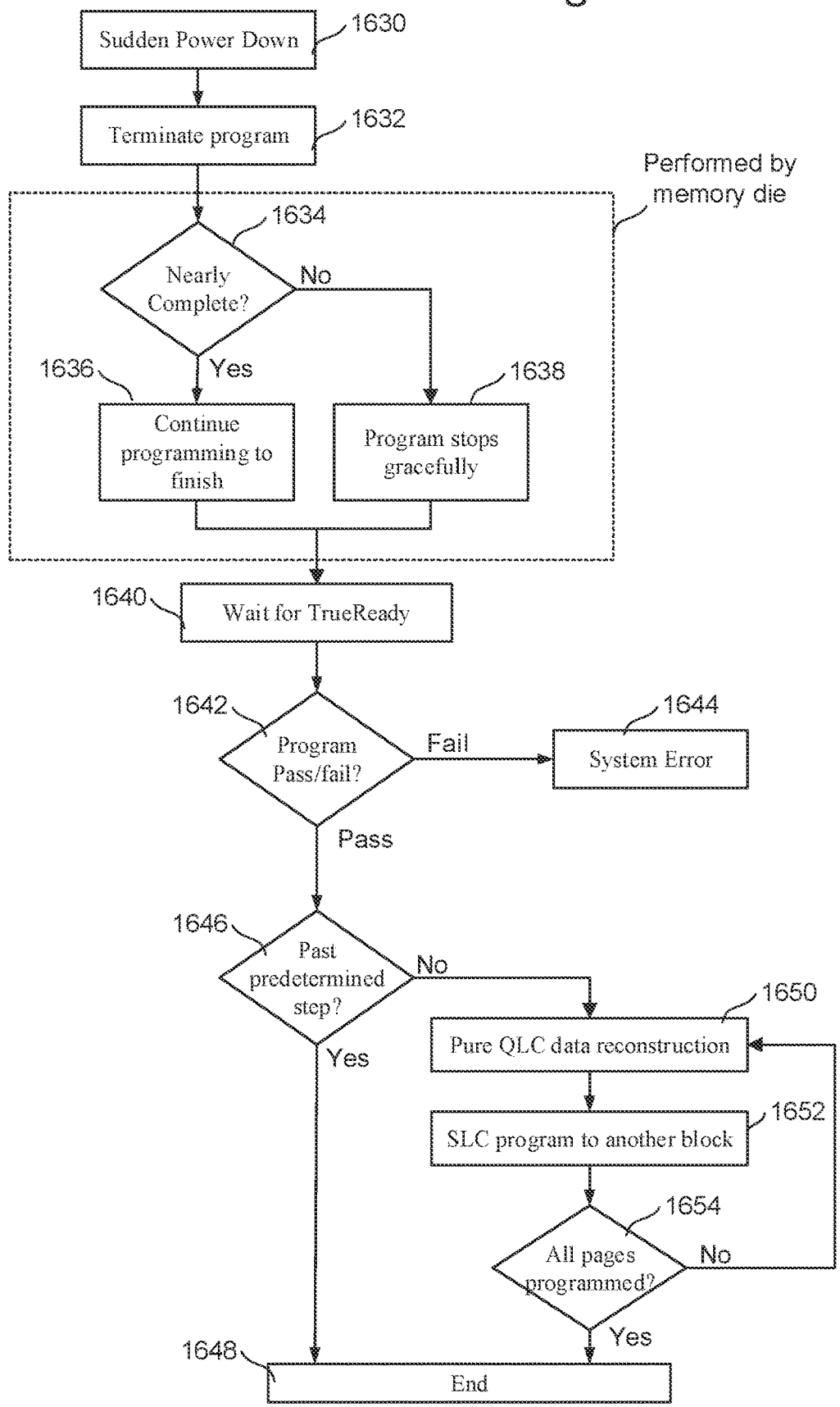
FIG. 16 shows an example of a method of handling an SPD.

FIG. 16 illustrates an example of a method that utilizes the present technology to prepare for loss of power efficiently (e.g., within a time and/or power limit). The method may be implemented, for example, in memory die 300 (e.g., NAND die) coupled to controller 102. When a Sudden Power Down 1630 is indicated, a memory controller (e.g., controller 102) sends a terminate program command 1632 to a non-volatile memory die (e.g., memory die 300). The memory die, which is executing a fine programming operation, then determines if fine programming is complete 1634 (e.g., if fine programming has progressed beyond a predetermined stage, such as programming of final data state S13). If programming is nearly complete, then the memory die continues to finish fine programming 1636 and asserts a ready condition to the controller. If programming is not complete, then the memory die stops programming gracefully 1638 (e.g., stopping fine programming at an intermediate stage as illustrated in FIG. 11) and asserts a ready condition to the controller. Steps 1634, 1636, and 1638 are performed by the memory die (e.g., by control circuits 310 and read/write circuits 328 of memory die 300) in this example. The memory controller waits for a TrueReady condition (e.g., on RB line) 1640 and then checks programming status pass/fail 1642. If a program fail is indicated then it is treated as a system error 1644, which may prevent safely storing data prior to power loss. If a program pass is indicated then the memory controller checks whether programming progressed past a predetermined step 1646 (e.g., past programming of final data state S13) used by the memory die in step 1634. In this way, the memory controller determines which of steps 1636 or 1638 the memory die performed. If programming has progressed past the predetermined step, then, because the memory die has completed fine programming at step 1636, the operation ends 1648. If programming has not progressed past the predetermined step, then the memory die sends appropriate commands to the memory controller to perform pure QLC data reconstruction 1650 (e.g., by combining first partial data from reading non-volatile memory cells with second partial data from data latches for one or more specified logical pages) and to SLC program the resulting complete logical pages of data to another block 1652 (e.g., as shown in FIG. 12). These steps are repeated until it is determined that all identified pages (e.g., one or more of LP, MP, UP, TP identified as requiring recovery) are programmed 1654, at which point the operation ends 1648.

FIG. 17 illustrates an example of a method that utilizes the present technology to prepare for loss of power efficiently (e.g., within a time and/or power limit). The method may be implemented, for example, in memory die 300 (e.g., NAND die) coupled to controller 102. The method includes programming a plurality of non-volatile memory cells from a plurality of initial data states to a plurality of final data states in a fine programming operation 1760 and aborting fine programming of the plurality of non-volatile memory cells prior to completion of programming of all final data states 1762 (e.g., aborting at an intermediate stage as illustrated in FIG. 11). The method further includes identifying a logical page of data to be recovered 1764 (e.g., one or more of LP, MP, UP, TP), reading the plurality of non-volatile memory cells to obtain read data of the logical page 1766, combining the read data of the logical page with latched data in a plurality of latches for programming of the logical page to obtain a complete recovered logical page of data 1768, and storing the complete recovered logical page of data in another plurality of non-volatile memory cells 1770.

While specific examples are described above, including specific encoding schemes associated with an example of MLC-fine programming, it will be understood that aspects of the present technology are not limited to such examples and may be extended to a wide variety of non-volatile memories using a variety of programming schemes and encoding schemes. Aspects of the present technology may be implemented using any suitable hardware. For example, control circuits 310 and/or read/write circuits 328 may perform steps described above and may be considered means for fine programming the plurality of non-volatile memory cells from initial data states to final data states, aborting fine programming of the plurality of non-volatile memory cells at an intermediate stage, reading the plurality of non-volatile memory cells at the intermediate stage to obtain first partial data of at least one logical page, and obtain the at least one logical page of data by combining the first partial data with second partial data of the at least one logical page stored in data latches An example of an apparatus includes one or more control circuits configured to connect to a plurality of non-volatile memory cells through a plurality of word lines. The one or more control circuits are configured to: abort fine programming of the plurality of non-volatile memory cells at an intermediate stage, read the plurality of non-volatile memory cells at the intermediate stage to obtain first partial data of at least one logical page, and obtain the at least one logical page of data by combining the first partial data with second partial data of the at least one logical page stored in data latches.

The plurality of non-volatile memory cells may be in a first block and the one or more control circuits are further configured to program the at least one logical page of data in Single Level Cell (SLC) format in second block. The one or more control circuits may be configured to fine program the plurality of non-volatile memory cells from four initial data states representing two logical pages of data to sixteen final data states representing four logical pages of data. The apparatus of claim 1, wherein the one or more control circuits are configured to abort fine programming in response to an abort command received prior to a predetermined stage of fine programming, the one or more control circuits further configured to complete fine programming in response to an abort command received after the predetermined stage of fine programming. The one or more control circuits may be further configured to convert the first partial data in the data latches from a program format to a user data format prior to combining with the first partial data. The one or more control circuits and the plurality of non-volatile memory cells may be located on a memory die, the one or more control circuits configured to abort fine programming in response to an abort command from a memory controller and to obtain the at least one logical page of data in response to a command from the memory controller identifying the at least one logical page of data. The one or more control circuits may be configured to fine program the plurality of non-volatile memory cells from four initial data states representing two initial logical pages of data to sixteen final data states representing four logical pages of data and the at least one logical page of data identified in the command may include at least one of the two initial logical pages of data. The one or more control circuits may be further configured to program the at least one logical page of data in Single Level Cell (SLC) format in another plurality of non-volatile memory cells within at least one of a time limit or a power limit prior to loss of power to the memory die. The memory controller may be further configured to detect an imminent power loss and in response send the abort command to the memory die to cause the one or more control circuits to abort fine programming. The memory controller may be further configured to determine that fine programming is incomplete, identify the at least one logical page of data to the memory die to cause the memory die to obtain and program the at least one logical page of data in Single Level Cell (SLC) non-volatile memory cells, and subsequent to restoration of power after the power loss recover the at least one logical page of data from the SLC non-volatile memory cells.

An example of a method includes programming a plurality of non-volatile memory cells from a plurality of initial data states to a plurality of final data states in a fine programming operation, aborting fine programming of the plurality of non-volatile memory cells prior to completion of programming of all final data states, and identifying a logical page of data to be recovered. The method further includes reading the plurality of non-volatile memory cells to obtain read data of the logical page of data, combining the read data of the logical page of data with latched data in a plurality of latches for programming of the logical page of data to obtain a complete recovered logical page of data, and storing the complete recovered logical page of data in another plurality of non-volatile memory cells.

Reading the plurality of non-volatile memory cells may include reading at fewer than all read voltages used to read all final data states. The latched data may include inverted bits resulting from read verify during fine programming of the plurality of non-volatile memory cells such that the latched data represents an incomplete copy of the logical page of data. Reading the plurality of non-volatile memory cells may include reading one or more data states that are fine programmed and for which latched data is unavailable. The plurality of non-volatile memory cells may be in a first block and storing the complete recovered logical page of data may include storing the complete recovered logical page of data in a second block. Storing the complete recovered logical page of data may include storing in one bit per cell in the second block. The method may include subsequently losing power for a period of time; subsequently recovering power; and subsequently reading the complete recovered logical page of data from the second block. The method may include prior to aborting fine programming, converting the logical page of data from an initial format to a program format; storing the logical page of data in the program format in the plurality of latches for programming; and prior to combining the read data of the logical page of data with the latched data, converting the latched data back to the initial format.

An example of a data storage system includes a plurality of non-volatile memory cells coupled to a plurality of word lines and means for fine programming the plurality of non-volatile memory cells from initial data states to final data states, aborting fine programming of the plurality of non-volatile memory cells at an intermediate stage, reading the plurality of non-volatile memory cells at the intermediate stage to obtain first partial data of at least one logical page, and obtain the at least one logical page of data by combining the first partial data with second partial data of the at least one logical page stored in data latches.

The plurality of non-volatile memory cells may be configured for programming into four data states representing two bits of data in a first programming operation and subsequent programming into sixteen data states representing the two bits of data and an additional two bits of data in a second programming operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a plurality of non-volatile memory cells,
the one or more control circuits are configured to:
initiate fine programming of the plurality of non-volatile memory cells from initial data states to final data states such that memory cells programmed to a first initial data state are fine programmed to at least a first final data state and a second final data state that are separated by a third final data state corresponding to a second initial data state, abort fine programming of the plurality of non-volatile memory cells at an intermediate stage, read the plurality of non-volatile memory cells at the intermediate stage to obtain first partial data of at least one logical page, and obtain the at least one logical page of data by combining the first partial data with second partial data of the at least one logical page stored in data latches.

2. The apparatus of claim 1 wherein the plurality of non-volatile memory cells are in a first block and the one or more control circuits are further configured to program the at least one logical page of data in Single Level Cell (SLC) format in second block.

3. The apparatus of claim 1, wherein the one or more control circuits are configured to fine program the plurality of non-volatile memory cells from four initial data states representing two logical pages of data to sixteen final data states representing four logical pages of data.

4. The apparatus of claim 1, wherein the one or more control circuits are configured to abort fine programming in response to an abort command received prior to a predetermined stage of fine programming, the one or more control circuits further configured to complete fine programming in response to an abort command received after the predetermined stage of fine programming.

5. The apparatus of claim 1, wherein the one or more control circuits are further configured to convert the first partial data in the data latches from a program format to a user data format prior to combining with the first partial data.

6. The apparatus of claim 1, wherein the one or more control circuits and the plurality of non-volatile memory cells are located on a memory die, the one or more control circuits configured to abort fine programming in response to an abort command from a memory controller and to obtain the at least one logical page of data in response to a command from the memory controller identifying the at least one logical page of data.

7. The apparatus of claim 6, wherein the one or more control circuits are configured to fine program the plurality of non-volatile memory cells from four initial data states representing two initial logical pages of data to sixteen final data states representing four logical pages of data and the at least one logical page of data identified in the command includes at least one of the two initial logical pages of data.

8. The apparatus of claim 6, wherein the one or more control circuits are further configured to program the at least one logical page of data in Single Level Cell (SLC) format in another plurality of non-volatile memory cells within at least one of a time limit or a power limit prior to loss of power to the memory die.

9. The apparatus of claim 6, wherein the memory controller is further configured to detect an imminent power loss and in response send the abort command to the memory die to cause the one or more control circuits to abort fine programming.

10. The apparatus of claim 9, wherein the memory controller is further configured to determine that fine programming is incomplete, identify the at least one logical page of data to the memory die to cause the memory die to obtain and program the at least one logical page of data in Single Level Cell (SLC) non-volatile memory cells, and subsequent to restoration of power after the power loss, recover the at least one logical page of data from the SLC non-volatile memory cells.

11. A method comprising:
programming a plurality of non-volatile memory cells from a plurality of initial data states to a plurality of final data states in a fine programming operation in which non-volatile memory cells from a first initial data state are programmed to a first threshold voltage range and a second threshold voltage range that are separated by a third threshold voltage range and non-volatile memory cells from a second initial data state are programmed to the third threshold voltage range;
aborting fine programming of the plurality of non-volatile memory cells prior to completion of programming of all final data states;
identifying a logical page of data to be recovered;
reading the plurality of non-volatile memory cells to obtain read data of the logical page of data;
combining the read data of the logical page of data with latched data in a plurality of latches for programming of the logical page of data to obtain a complete recovered logical page of data; and
storing the complete recovered logical page of data in another plurality of non-volatile memory cells.

12. The method of claim 11 wherein reading the plurality of non-volatile memory cells includes reading at fewer than all read voltages used to read all final data states.

13. The method of claim 12 wherein the latched data includes inverted bits resulting from read verify during fine programming of the plurality of non-volatile memory cells such that the latched data represents an incomplete copy of the logical page of data.

14. The method of claim 11 wherein reading the plurality of non-volatile memory cells includes reading one or more data states that are fine programmed and for which latched data is unavailable.

15. The method of claim 11 wherein the plurality of non-volatile memory cells are in a first block and storing the complete recovered logical page of data includes storing the complete recovered logical page of data in a second block.

16. The method of claim 15 wherein storing the complete recovered logical page of data includes storing in one bit per cell in the second block.

17. The method of claim 16 further comprising:
subsequently losing power for a period of time;
subsequently recovering power; and
subsequently reading the complete recovered logical page of data from the second block.

18. The method of claim 11 further comprising:
prior to aborting fine programming, converting the logical page of data from an initial format to a program format;
storing the logical page of data in the program format in the plurality of latches for programming; and
prior to combining the read data of the logical page of data with the latched data, converting the latched data back to the initial format.

19. A data storage system comprising:
a plurality of non-volatile memory cells coupled to a plurality of word lines; and
means for fine programming the plurality of non-volatile memory cells from initial data states to final data states in a fine programming operation in which non-volatile memory cells from a first initial data state are programmed to a first threshold voltage range and a second threshold voltage range that are separated by a third threshold voltage range and non-volatile memory cells from a second initial data state are programmed to the third threshold voltage range, aborting fine programming of the plurality of non-volatile memory cells at an intermediate stage, reading the plurality of non-volatile memory cells at the intermediate stage to obtain first partial data of at least one logical page, and obtain the at least one logical page of data by combining the first partial data with second partial data of the at least one logical page stored in data latches.

20. The data storage system of claim 19, wherein the plurality of non-volatile memory cells are configured for programming into four data states representing two bits of data in a first programming operation and subsequent programming into sixteen data states representing the two bits of data and an additional two bits of data in a second programming operation.

* * * * *